(12) United States Patent
Ouyang

(10) Patent No.: US 11,545,370 B2
(45) Date of Patent: Jan. 3, 2023

(54) METHOD FOR FORMING PATTERN AND MANUFACTURING METHOD OF PACKAGE

(71) Applicant: Taiwan Semiconductor Manufacturing Co., Ltd., Hsinchu (TW)

(72) Inventor: Christine Y Ouyang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/260,122

(22) Filed: Jan. 29, 2019

(65) Prior Publication Data

US 2020/0135496 A1    Apr. 30, 2020

Related U.S. Application Data

(60) Provisional application No. 62/752,352, filed on Oct. 30, 2018.

(51) Int. Cl.
| | |
|---|---|
| *H01L 21/56* | (2006.01) |
| *H01L 23/00* | (2006.01) |
| *H01L 21/48* | (2006.01) |
| *H01L 23/528* | (2006.01) |
| *H01L 23/31* | (2006.01) |
| *H01L 23/522* | (2006.01) |

(52) U.S. Cl.
CPC .......... *H01L 21/563* (2013.01); *H01L 21/486* (2013.01); *H01L 21/4853* (2013.01); *H01L 23/3114* (2013.01); *H01L 23/3128* (2013.01); *H01L 23/5226* (2013.01); *H01L 23/5283* (2013.01); *H01L 24/09* (2013.01); *H01L 24/11* (2013.01); *H01L 24/17* (2013.01); *H01L 2224/0231* (2013.01); *H01L 2224/02373* (2013.01); *H01L 2224/0401* (2013.01)

(58) Field of Classification Search
CPC ............. H01L 51/0036; H01L 51/5056; H01L 51/5088; H01L 51/50; H01L 21/0337; H01L 51/0043; H01L 51/0026; H01L 51/0028; H01L 51/004; H01L 51/0575
See application file for complete search history.

(56) References Cited

U.S. PATENT DOCUMENTS

| | | |
|---|---|---|
| 8,716,841 B1 | 5/2014 | Chang et al. |
| 8,736,084 B2 | 5/2014 | Cheng et al. |
| 8,796,666 B1 | 8/2014 | Huang et al. |

(Continued)

*Primary Examiner* — Tony Tran
(74) *Attorney, Agent, or Firm* — JCIPRNET

(57) ABSTRACT

A method for forming a pattern includes at least the following steps. A first material and a second material abutting the first material are provided. The first material and the second material have different radiation absorption rates. A blocking layer is formed over the first material and the second material. The blocking layer is globally irradiated with an electromagnetic radiation to allow part of the blocking layer to turn into a crosslinked portion. The remaining blocking layer forms a non-crosslinked portion. The non-crosslinked portion covers the second material. The non-crosslinked portion of the blocking layer is removed to expose the second material. A third material is formed over the exposed second material. The crosslinked portion of the blocking layer is removed.

14 Claims, 30 Drawing Sheets

(56) References Cited

U.S. PATENT DOCUMENTS

| | | |
|---|---|---|
| 8,837,810 B2 | 9/2014 | Chen et al. |
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,093,530 B2 | 7/2015 | Huang et al. |
| 9,111,949 B2 | 8/2015 | Yu et al. |
| 9,134,633 B2 | 9/2015 | Lin et al. |
| 9,230,867 B2 | 1/2016 | Cheng et al. |
| 9,263,511 B2 | 2/2016 | Yu et al. |
| 9,281,254 B2 | 3/2016 | Yu et al. |
| 9,304,403 B2 | 4/2016 | Lin et al. |
| 9,368,460 B2 | 6/2016 | Yu et al. |
| 9,372,206 B2 | 6/2016 | Wu et al. |
| 9,404,743 B2 | 8/2016 | Chiu et al. |
| 9,496,189 B2 | 11/2016 | Yu et al. |
| 9,548,303 B2 | 1/2017 | Lee et al. |
| 2007/0231583 A1* | 10/2007 | Iizuka ............... B32B 27/42 428/423.7 |
| 2010/0068657 A1* | 3/2010 | Yang ............... H01L 21/0273 430/323 |
| 2013/0062709 A1* | 3/2013 | Chang ............... H01L 29/51 257/411 |
| 2014/0272723 A1* | 9/2014 | Somervell ......... G03F 7/0035 430/325 |

\* cited by examiner

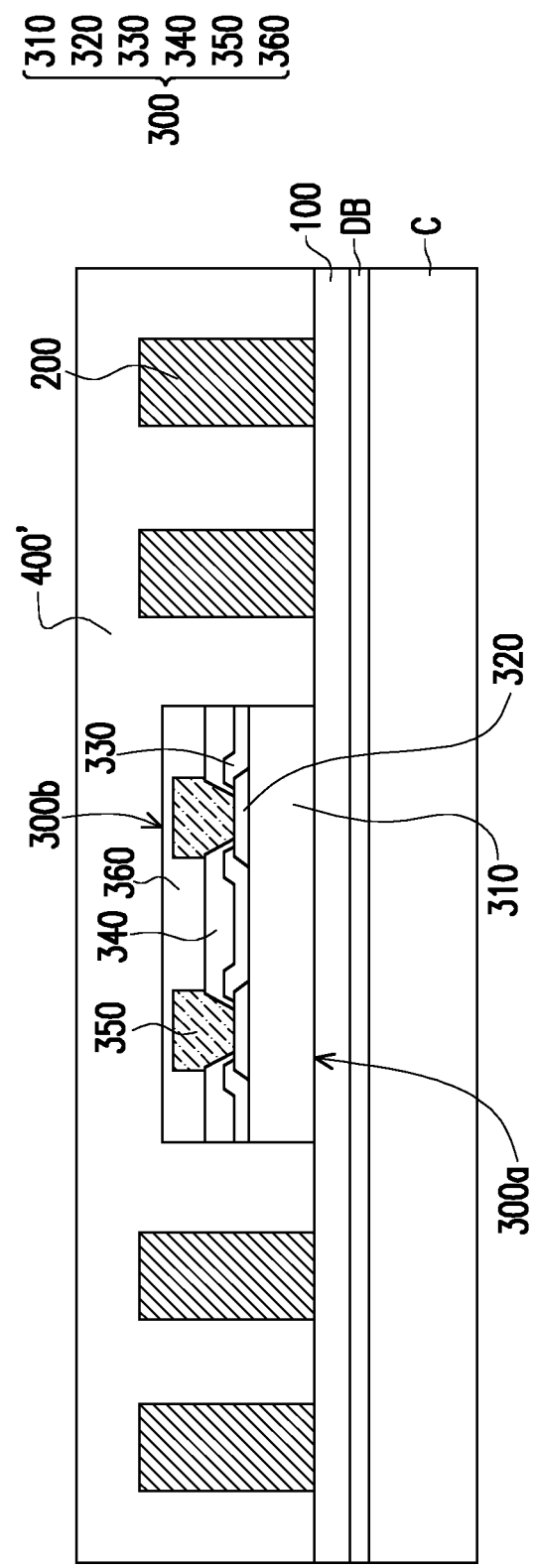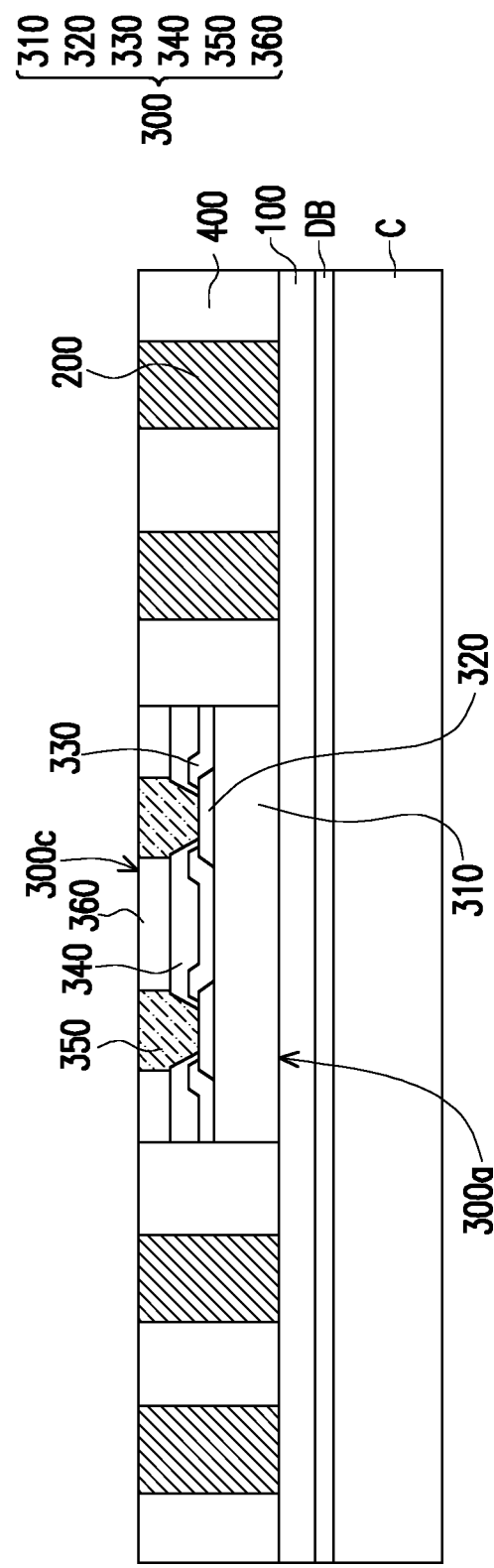

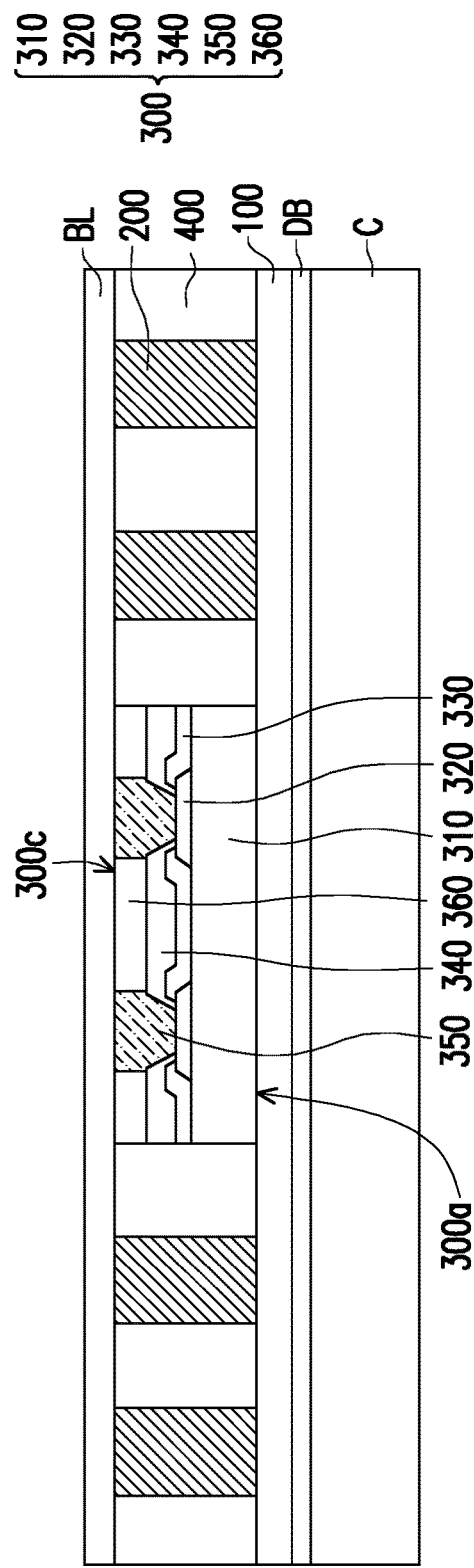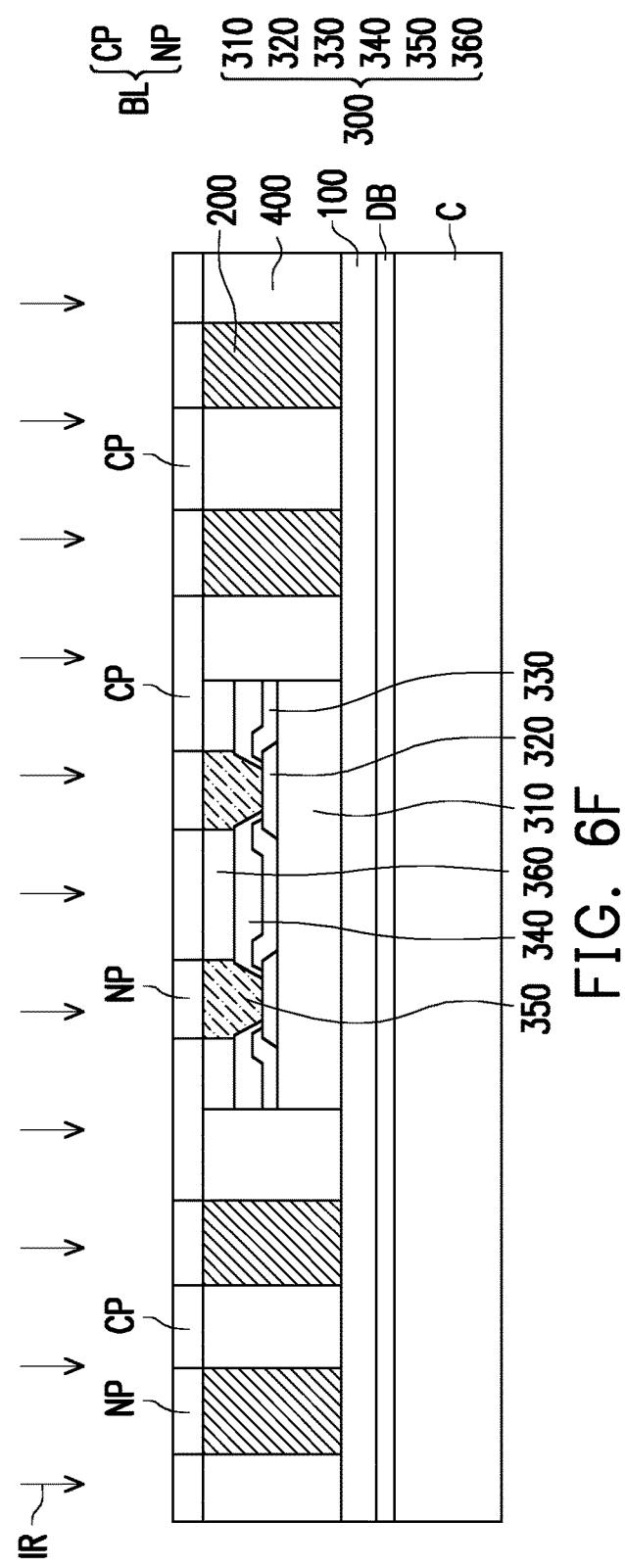

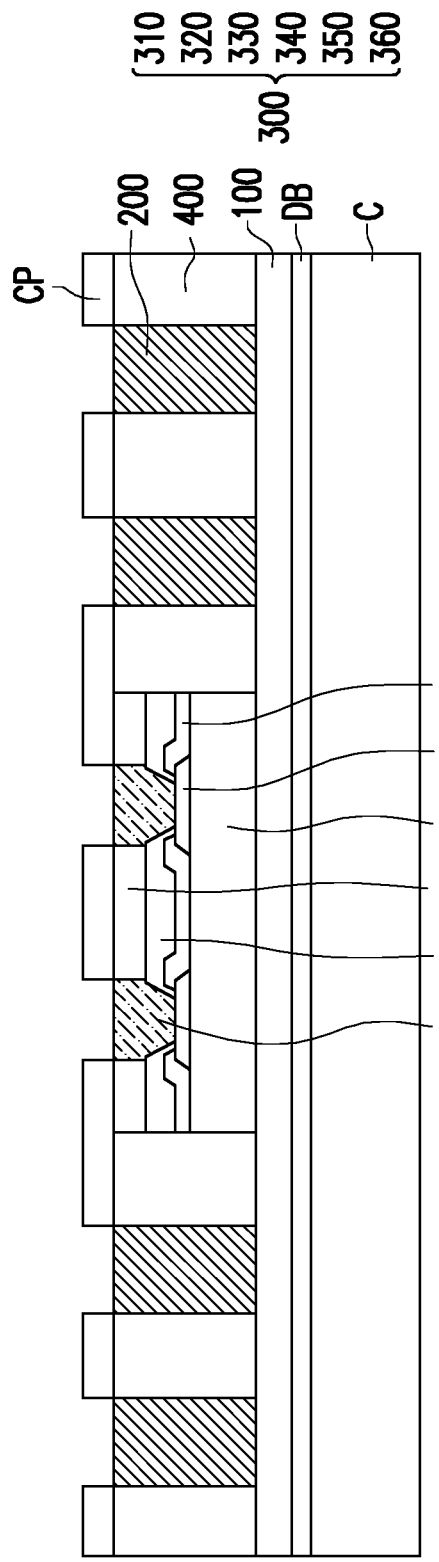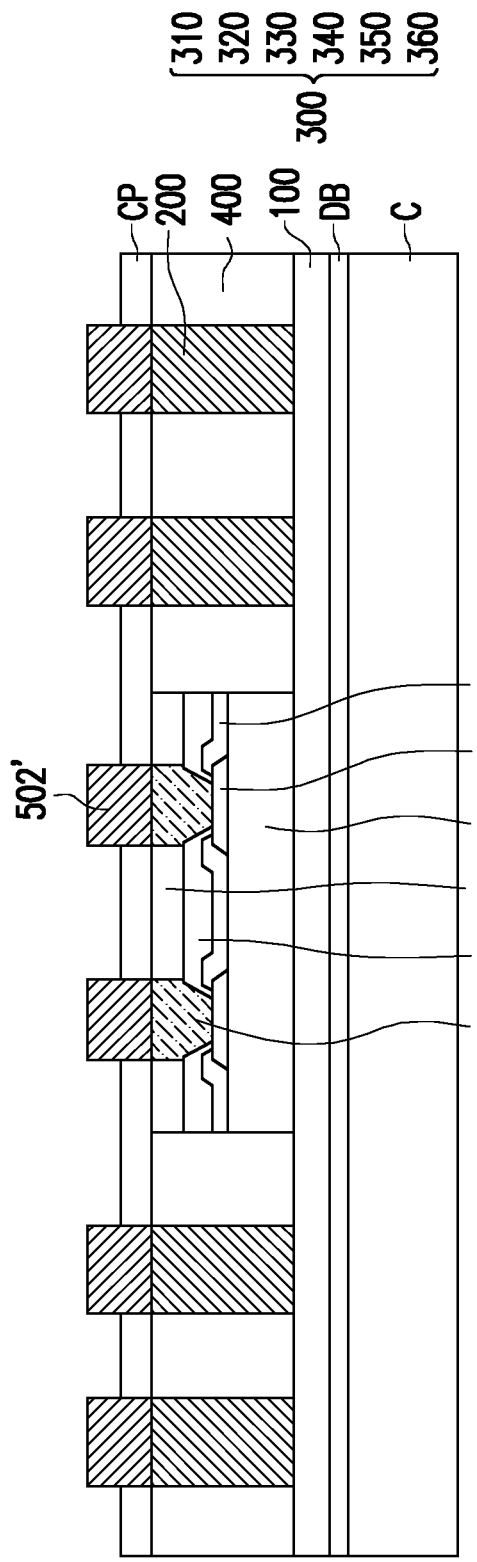

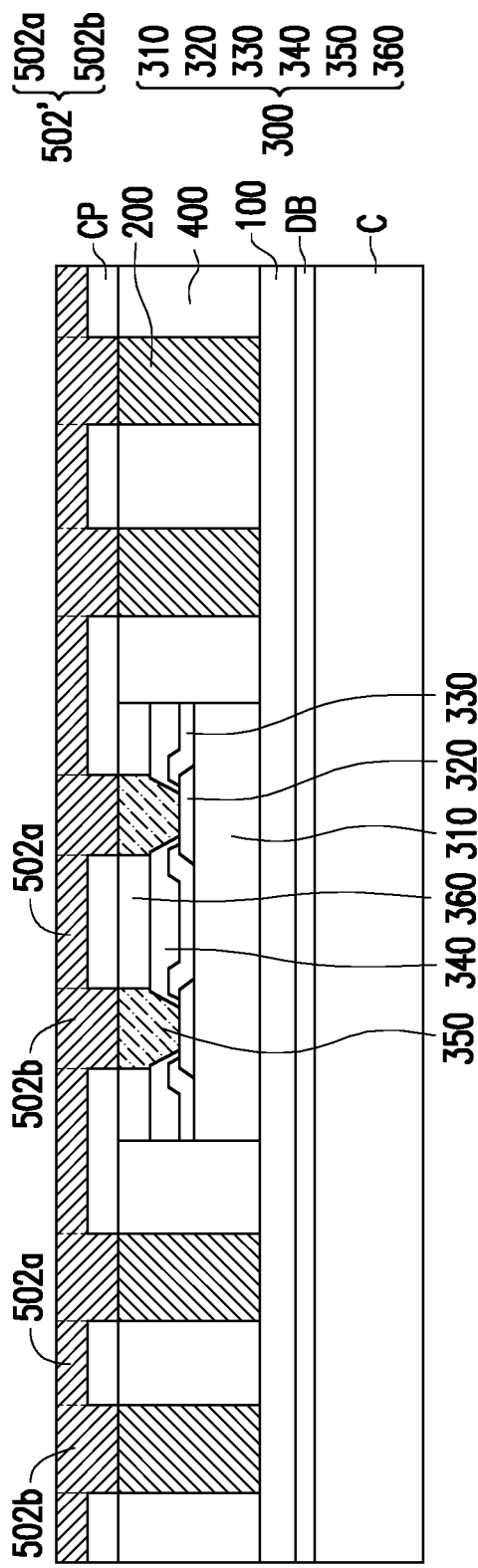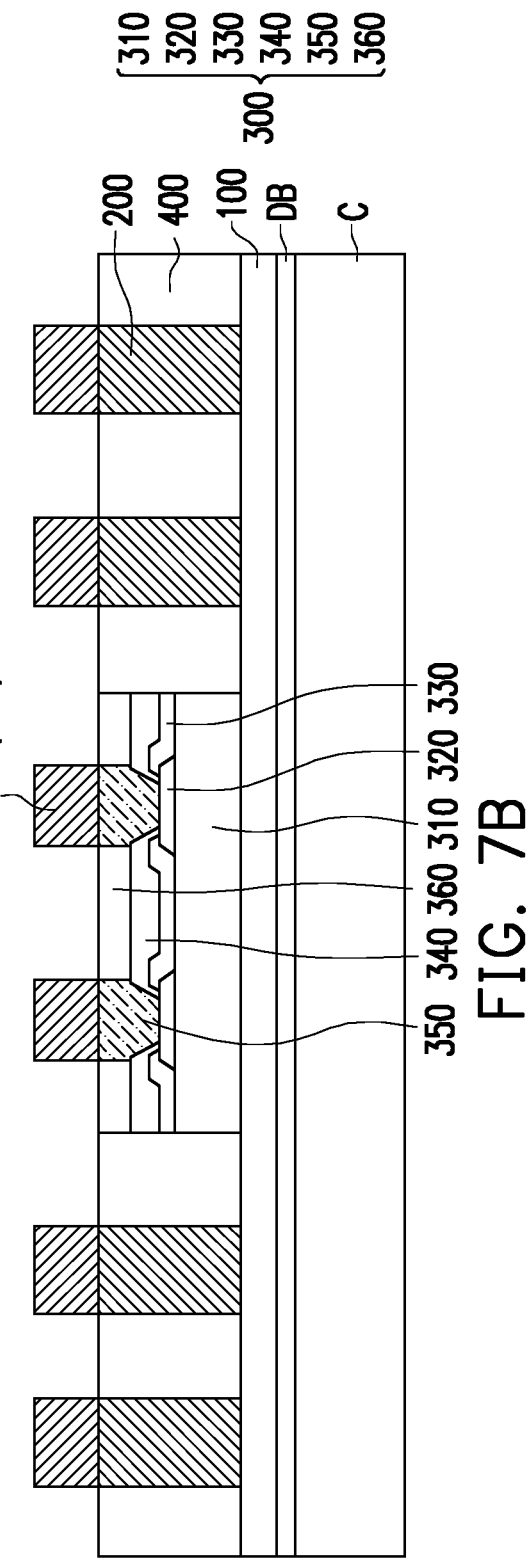

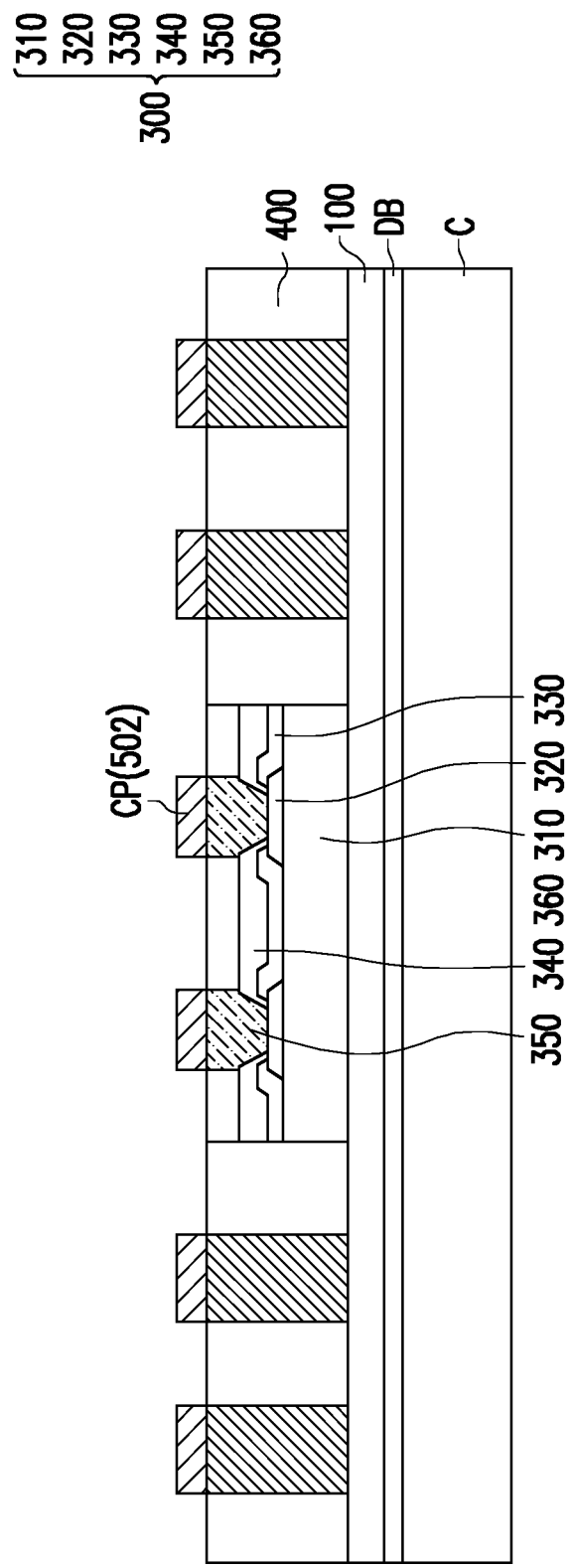

a part of this specification.
METHOD FOR FORMING PATTERN AND MANUFACTURING METHOD OF PACKAGE

CROSS-REFERENCE TO RELATED APPLICATION

This application claims the priority benefit of U.S. provisional application Ser. No. 62/752,352, filed on Oct. 30, 2018. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies have been developed for the wafer level packaging. For example, pattern forming technologies play significant roles in the wafer level packaging. How to ensure the quality of the patterns and the process simplicity have become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A to FIG. 7B are schematic cross-sectional views illustrating intermediate stages of a manufacturing process of a package in accordance with some alternative embodiments of the disclosure.

FIG. 8A to FIG. 8C are schematic cross-sectional views illustrating intermediate stages of a manufacturing process of a package in accordance with some alternative embodiments of the disclosure.

DETAILED DESCRIPTION

Figure 1A:
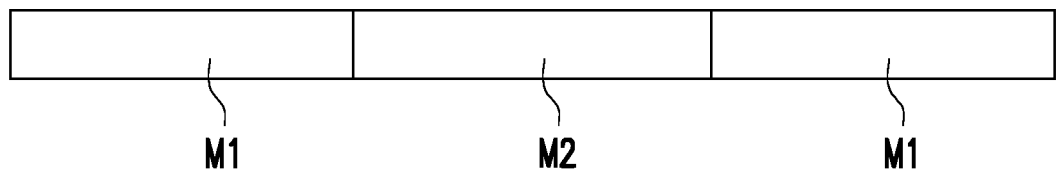
FIG. 1A to FIG. 1F are schematic cross-sectional views illustrating a method for forming a pattern in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross-sectional views illustrating a method for forming a pattern P in accordance with some embodiments of the disclosure. Referring to FIG. 1A, a first material M1 and a second material M2 are provided. In some embodiments, the first material M1 abuts the second material M2. For example, the first material M1 laterally surrounds the second material M2. In some embodiments, the first material M1 is directly in contact with the second material M2. In some embodiments, the first material M1 and the second material M2 are different. For example, the first material M1 and the second material M2 have different radiation absorption rates. That is, the ability to absorb radiation having certain wavelength is different in the first material M1 and the second material M2. In some embodiments, the first material M1 and the second material M2 may have the same surface property. For example, a surface energy of the first material M1 may be the same as or similar to a surface energy of the second material M2.

In some embodiments, the first material M1 and the second material M2 respectively includes conductive material, semiconductor material, or dielectric material. In some embodiments, examples of the conductive material include aluminum, titanium, copper, nickel, gold, silver, tungsten, ruthenium, molybdenum, manganese, zirconium, hafnium, and/or alloys thereof. In some embodiments, examples of the semiconductor material include a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, examples of the dielectric material include silicon nitride (SiN), silicon oxide (SiO), silicon oxynitride (SiON), carbonized silicon nitride (SiCN), silicon carbon oxynitride (SiCON), polyimide, epoxy resin, acrylic resin, phenol resin, benzocyclobutene (BCB), polybenzoxazole (PBO), molding compound, or the like. In some alternative embodiments, the dielectric material includes metal oxides or metal nitrides. Examples of the metal oxide include $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or the like. Examples of the metal nitride include TiN, TaN, WN, TiAlN, TaCN, or the like. In some embodiments, the dielectric material may include a silicate such as HfSiO, HfSiON, LaSiO, AlSiO, or the like. It is understood that the materials listed above are merely exemplary illustration of the first material M1 and the second material M2. In some alternative embodiments, the first material M1 and the second material M2 may include other existing materials as long as the radiation absorption rate of the first material M1 is different from that of the second material M2.

Figure 1B:
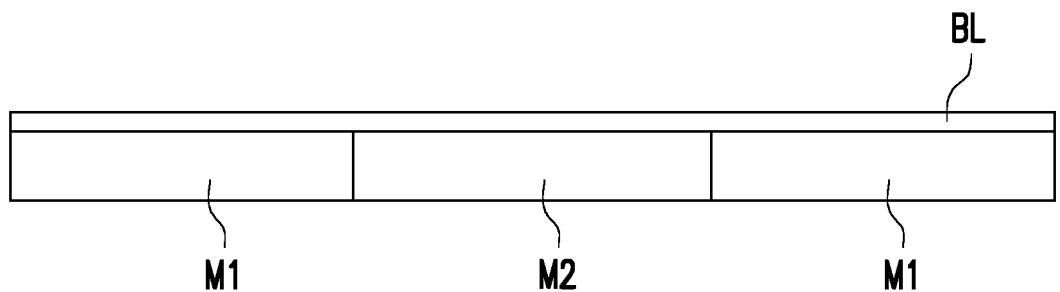

Referring to FIG. 1B, a blocking layer BL is formed over the first material M1 and the second material M2. In some embodiments, the blocking layer BL conformally and fully covers the first material M1 and the second material M2. In some embodiments, the blocking layer BL includes crosslinkable polymeric material that is able to create a non-polar surface. For example, the blocking layer BL includes a bottom anti-reflective coating (BARC) material. In some embodiments, the BARC materials includes polysulfones, polyreas, polyuria sulfones, polyacrylates, poly(vinyl pyridine), poly (methyl methacrylates), polystyrenes, and/or the like. In some embodiments, the blocking layer BL is formed on the first material M1 and the second material M2 through spin coating. In some embodiments, the blocking layer BL is formed to have a thickness of 100 nm to 600 nm.

Figure 1C:
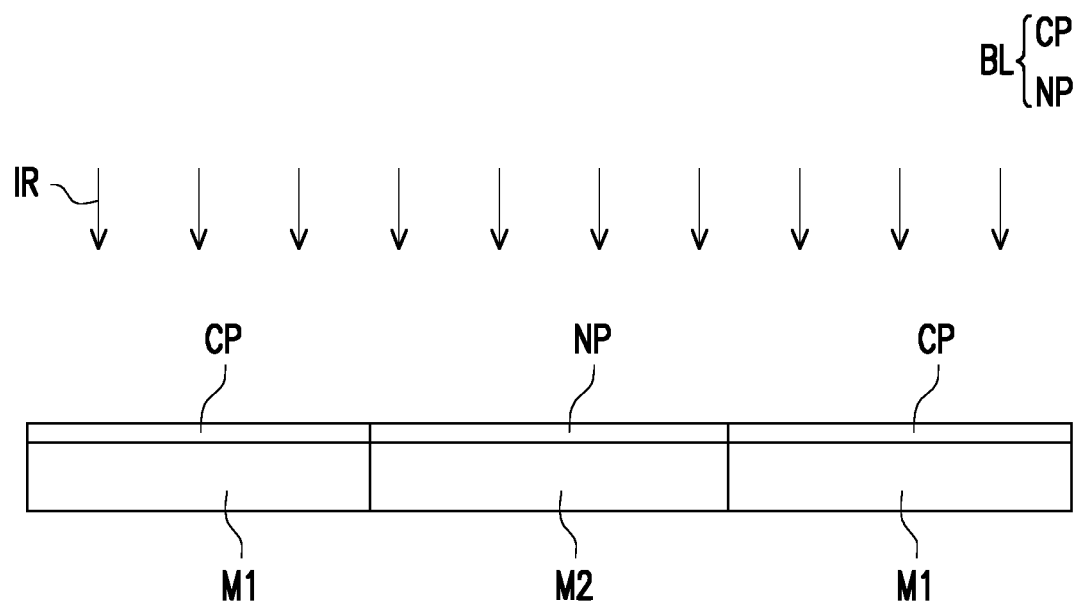

Referring to FIG. 1C, an irradiation process IR is performed on the blocking layer BL. During the irradiation process IR, an electromagnetic radiation is globally irradiated on the blocking layer BL. In some embodiments, the irradiation process IR includes a laser annealing process. That is, the electromagnetic radiation includes a laser beam having a wavelength of 600 nm to 1000 nm. In some embodiments, the dwell time for the laser annealing process may range from 0.25 ms to 100 ms. For example, the blocking layer BL may be irradiated by the laser beam for a period ranging from 0.25 ms to 100 ms. However, the disclosure is not limited thereto. In some alternative embodiments, the irradiation process IR may include a rapid thermal process (RTP). For example, a lamp which emits radiation having a wavelength of 200 to 1400 nm may be adapted as a radiation source for the irradiation process IR. In some embodiments, the temperature of the lamp may range from 200° C. to 800° C. In some embodiments, the dwell time for the rapid thermal process may range from 1 second to 100 seconds. For example, the blocking layer BL may be placed under the lamp for a period ranging from 1 second to 100 seconds. In some embodiments, the irradiation process IR may include one of the laser annealing process and the RTP process or may include both of the laser annealing process and the RTP process.

In some embodiments, during the irradiation process IR, a portion of the blocking layer BL is crosslinked. For example, when the radiation absorption rate of the first material M1 is greater than the radiation absorption rate of the second material M2, the first material M1 is heated up at a faster rate, thereby rendering a higher temperature as compared to the second material M2. The higher temperature serves as an activation threshold such that molecules in a portion of the blocking layer BL located directly above the first material M1 are crosslinked. On the other hand, molecules in another portion of the blocking layer BL are not activated and remain non-crosslinked. That is, part of the blocking layer BL turns into a crosslinked portion CP and another part of the blocking layer BL forms a non-crosslinked portion NP. As illustrated in FIG. 1C, the crosslinked portion CP covers the first material M1 and the non-crosslinked portion NP covers the second material M2.

Figure 1D:
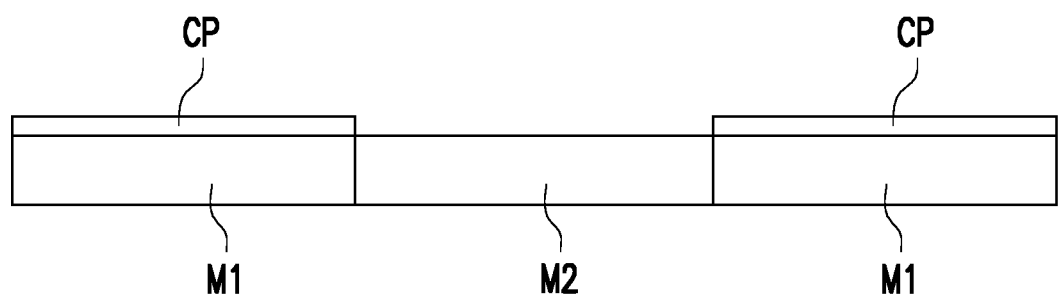

Referring to FIG. 1C and FIG. 1D, the non-crosslinked portion NP located directly above the second material M2 is removed. In some embodiments, the non-crosslinked portion NP of the blocking layer BL is removed through a wet cleaning process. In some embodiments, a cleaning solution utilized in the wet cleaning process includes propylene glycol methyl ether acetate (PGMEA), methyl ethyl ketone (MEK), isopropyl alcohol (IPA), or any other alcohol solvents. Upon removal of the non-crosslinked portion NP, the second material M2 is exposed by an opening created by the crosslinked portion CP.

Figure 1E:
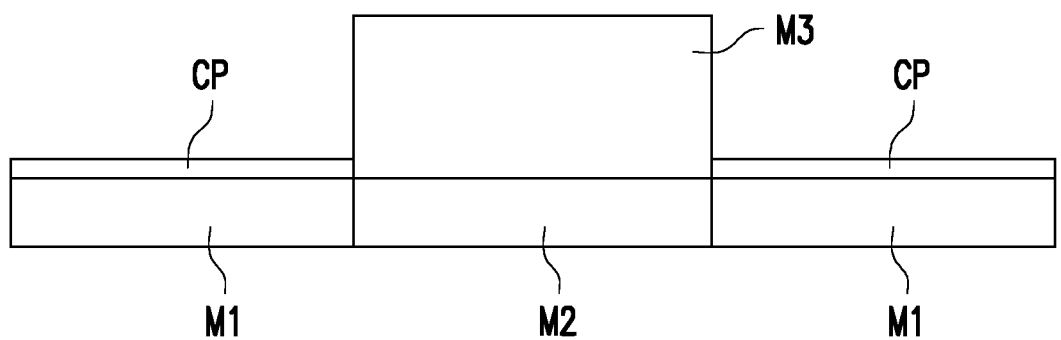

Referring to FIG. 1E, a third material M3 is formed over the exposed second material M2. In some embodiments, the third material M3 is different from both of the first material M1 and the second material M2. However, the disclosure is not limited thereto. In some alternative embodiment, the third material M3 may be the same as one of the first material M1 and the second material M2. In some embodiments, the third material M3 includes conductive material, semiconductor material, or dielectric material. In some embodiments, examples of the conductive material include aluminum, titanium, copper, nickel, gold, silver, tungsten, ruthenium, molybdenum, manganese, zirconium, hafnium, and/or alloys thereof. In some embodiments, examples of the semiconductor material include a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, examples of the dielectric material include silicon nitride (SiN), silicon oxide (SiO), silicon oxynitride (SiON), carbonized silicon nitride (SiCN), silicon carbon oxynitride (SiCON), polyimide, epoxy resin, acrylic resin, phenol resin, benzocyclobutene (BCB), polybenzoxazole (PBO), molding compound, or the like. In some alternative embodiments, the dielectric material includes metal oxides or metal nitrides. Examples of the metal oxide include $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or the like. Examples of the metal nitride include TiN, TaN, WN, TiAlN, TaCN, or the like. In some embodiments, the dielectric material may include a silicate such as HfSiO, HfSiON, LaSiO, AlSiO, or the like. It is understood that the materials listed above are merely exemplary illustration of the third material M3. In some alternative embodiments, the third material M3 may include other existing materials.

In some embodiments, the third material M3 is formed by atomic layer deposition (ALD). In some embodiments, ALD process is characterized in that the materials are deposited on a polar surface and are not formed on a non-polar surface. As mentioned above, the blocking layer BL is able to create a non-polar surface while the exposed surface of the second material M2 remains polar. As a result, the third material M3 is selectively formed on the second material M2 due to the nature of ALD. In some alternative embodiments, the third material M3 is formed by directional chemical vapor deposition (directional CVD). In embodiments, during the directional CVD process, the CVD process is assisted by a plasma to create a directional deposition. With the aid of the plasma, the third material M3 may be precisely deposited onto the exposed second material M2. As illustrated in FIG. 1E, the third material M3 is located within the opening created by the crosslinked portion CP and is directly in contact with the second material M2. On the other hand, the third material M3 is not located above the crosslinked portion CP.

Figure 1F:
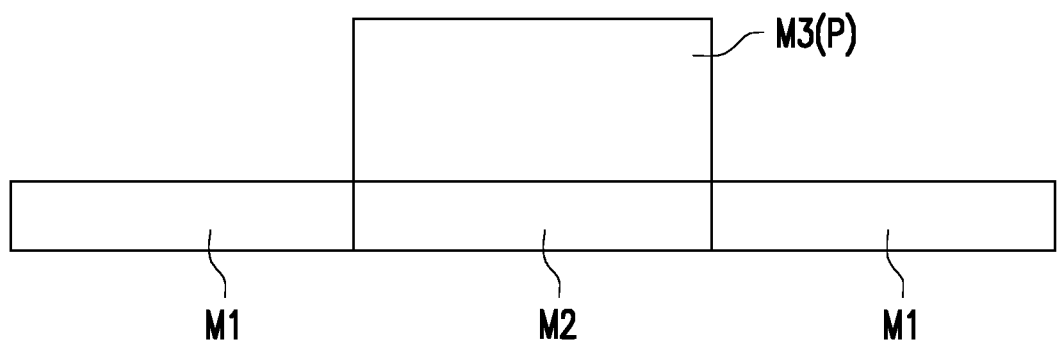

Referring to FIG. 1E and FIG. 1F, the crosslinked portion CP of the blocking layer BL is removed to render a pattern P over the second material M2. That is, the third material M3 forms the pattern P. In some embodiments, the crosslinked portion CP may be removed through a stripping process and/or an etching process. In some embodiments, with the aid of the blocking layer BL, the pattern P may be easily formed on a designated location. Since the blocking layer BL is formed through spin-coating, the complexity of using vapor deposition or soaking process may be eliminated, thereby simplifying the pattern forming process. In addition, as mentioned above, the first material M1 and the second material M2 may have the same or similar surface energies. As such, a surface treatment process on the first material M1 and the second material M2 for creating distinct surface energies may be omitted, thereby speeding up the pattern forming process. Moreover, with the aid of the blocking layer BL, selective deposition may be enabled on a broader class of materials. Furthermore, since the activation region of the blocking layer BL is determined by the underlying target material, the location precision of the target pattern P may be ensured. In other words, overlay issues, edge placement errors, or pattern collapse problems seen in conventional lithography can be eliminated, thereby rendering high quality patterns P.

FIG. 2A to FIG. 2F are schematic cross-sectional views illustrating a method for forming a pattern P in accordance with some alternative embodiments of the disclosure. The elements presented in FIG. 2A to FIG. 2F similar to the elements shown in FIG. 1A to FIG. 1F may be denoted by the same reference numeral as labelled in FIG. 1A to FIG. 1F. Referring to FIG. 2A to FIG. 2D, the steps illustrated in FIG. 2A to FIG. 2D are similar to the steps illustrated in FIG. 1A to FIG. 1D, so the detailed descriptions thereof are omitted herein.

Figure 2A:
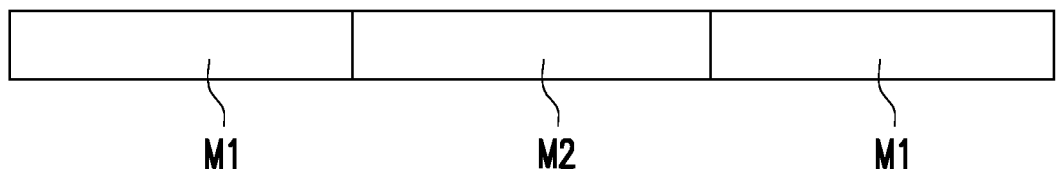
FIG. 2A to FIG. 2F are schematic cross-sectional views illustrating a method for forming a pattern in accordance with some alternative embodiments of the disclosure.
Figure 2B:
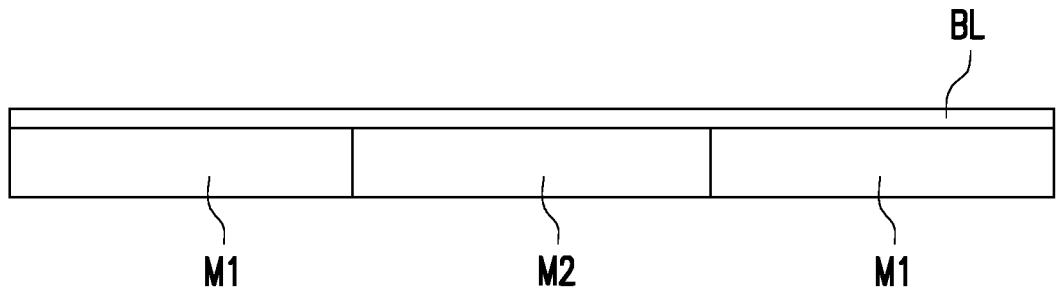
Figure 2C:
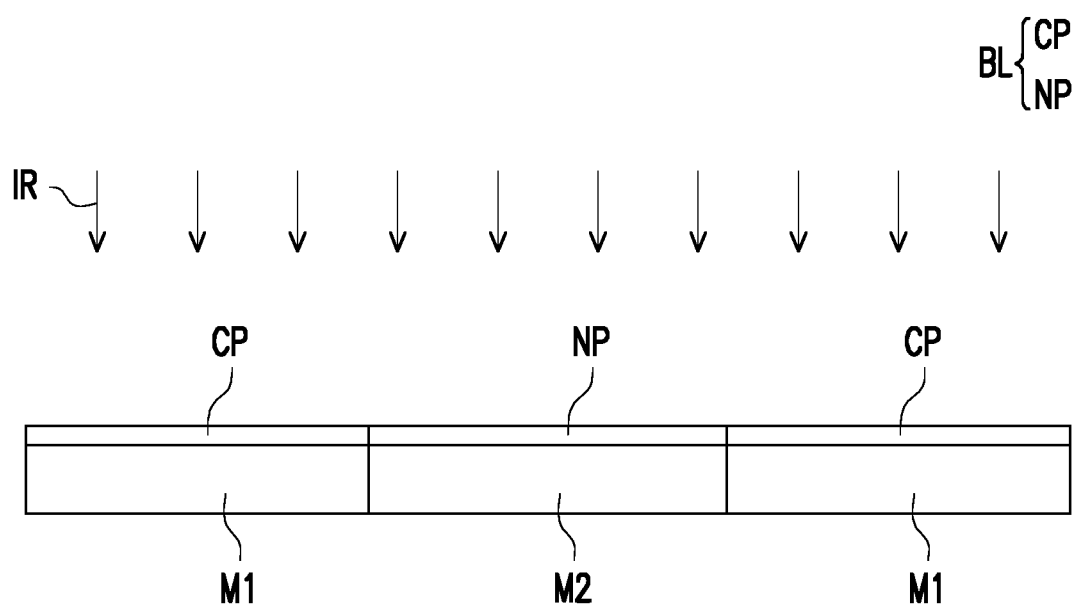
Figure 2D:
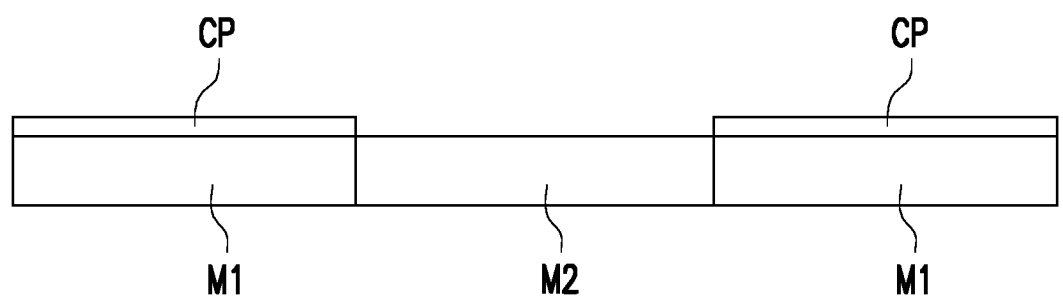
Figure 2E:
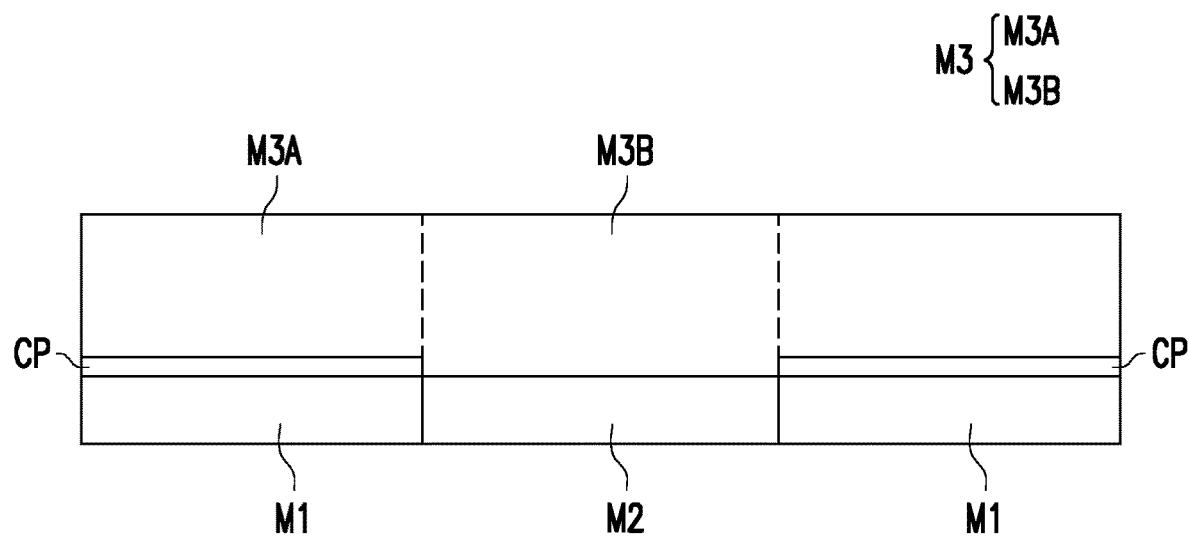

Referring to FIG. 2E, a third material M3 is formed over the crosslinked portion CP of the blocking layer BL and the exposed second material M2. In some embodiments, a material of the third material M3 in FIG. 2E may be similar to that of the third material M3 in FIG. 1E, so the detailed description thereof is omitted herein. In some embodiments, the third material M3 is formed by chemical vapor deposition (CVD). Due to the nature of CVD, the third material M3 fully covers the second material M2 and the crosslinked portion CP. As illustrated in FIG. 2E, the third material M3 may be divided into a first portion M3A and a second portion M3B. The first portion M3A is located directly above the first material M1 and the crosslinked portion CP while the second portion M3B is located directly above the second material M2.

Figure 2F:
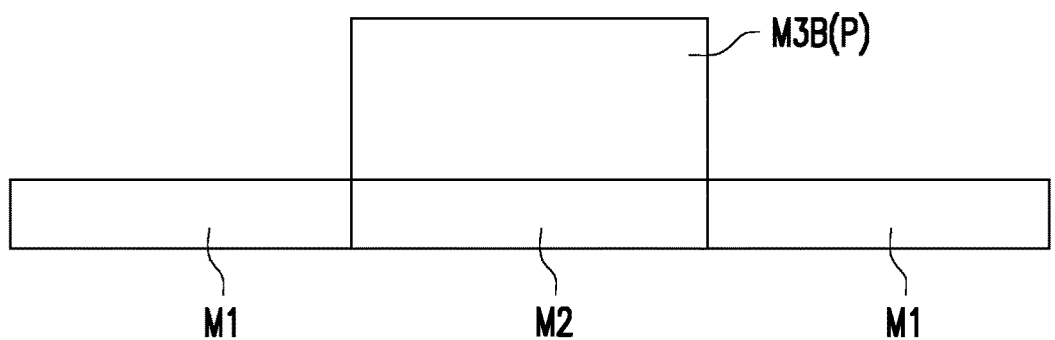

Referring to FIG. 2E and FIG. 2F, the crosslinked portion CP of the blocking layer BL and the first portion M3A of the third material M3 are removed to render a pattern P over the second material M2. That is, the second portion M3B of the third material M3 forms the pattern P. In some embodiments, the crosslinked portion CP of the blocking layer BL and the first portion M3A are removed simultaneously. For example, the first portion M3A located directly above the crosslinked portion CP may be lifted off while the crosslinked portion CP is being removed. In some embodiments, with the aid of the blocking layer BL, the pattern P may be easily formed on a designated location. Since the blocking layer BL is formed through spin-coating, the complexity of using vapor deposition or soaking process may be eliminated, thereby simplifying the pattern forming process. In addition, as mentioned above, the first material M1 and the second material M2 may have the same or similar surface energies. As such, a surface treatment process on the first material M1 and the second material M2 for creating distinct surface energies may be omitted, thereby speeding up and simplifying the pattern forming process. Furthermore, since the activation region of the blocking layer BL is determined by the underlying target material, the location precision of the target pattern P may be ensured. In other words, overlay issues, edge placement errors, or pattern collapse problems seen in conventional lithography can be eliminated, thereby rendering high quality patterns P.

Figure 3A:
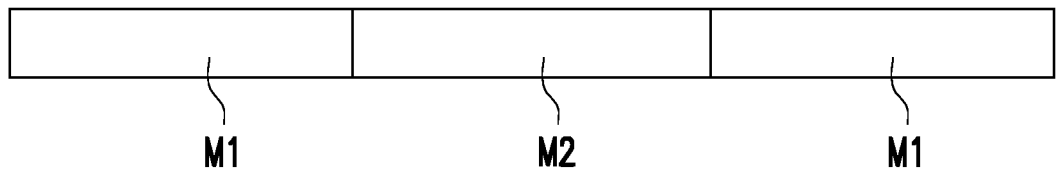
FIG. 3A to FIG. 3D are schematic cross-sectional views illustrating a method for forming a pattern in accordance with some alternative embodiments of the disclosure.
Figure 3B:
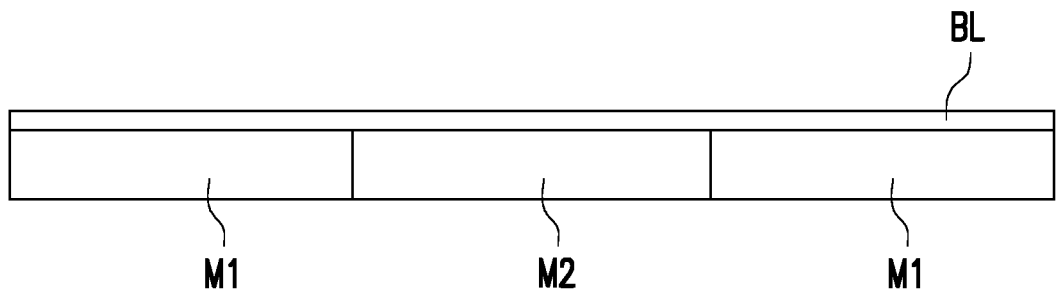

FIG. 3A to FIG. 3D are schematic cross-sectional views illustrating a method for forming a pattern P in accordance with some alternative embodiments of the disclosure. The elements presented in FIG. 3A to FIG. 3D similar to the elements shown in FIG. 1A to FIG. 1F may be denoted by the same reference numeral as labelled in FIG. 1A to FIG. 1F. Referring to FIG. 3A and FIG. 3B, the steps illustrated in FIG. 3A and FIG. 3B are similar to the steps illustrated in FIG. 1A and FIG. 1B, so the detailed descriptions thereof are omitted herein.

Figure 3C:
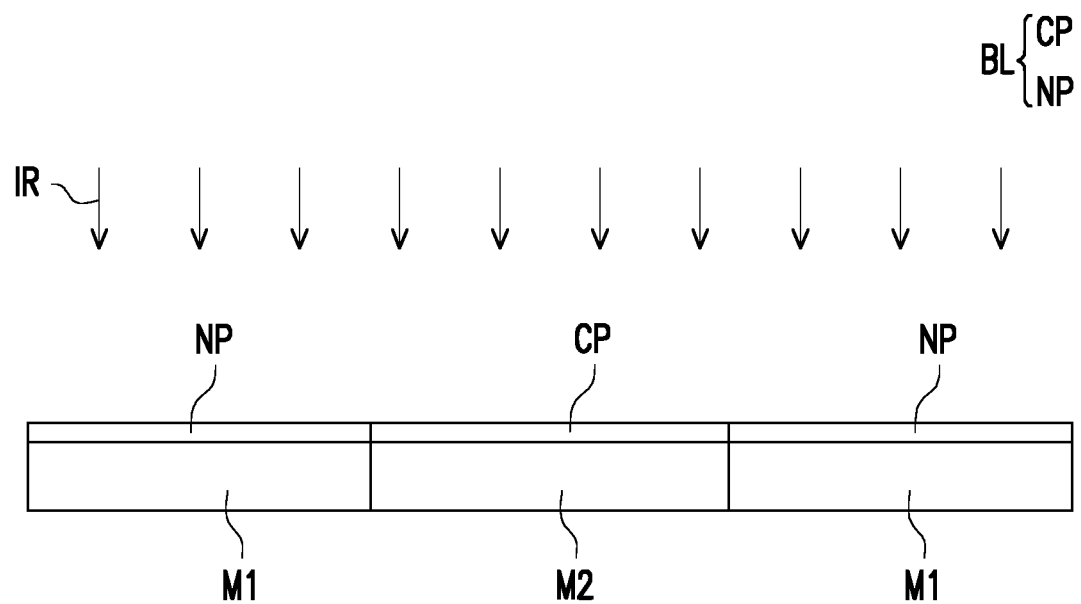

Referring to FIG. 3C, an irradiation process IR is performed on the blocking layer BL. The irradiation process IR in FIG. 3C is similar to the irradiation IR in FIG. 1C, so the detailed description thereof is omitted herein. In some embodiments, during the irradiation process IR, a portion of the blocking layer BL is crosslinked. For example, when the radiation absorption rate of the second material M2 is greater than the radiation absorption rate of the first material M1, the second material M2 is heated up at a faster rate, thereby rendering a higher temperature as compared to the first material M1. The higher temperature serves as an activation threshold such that molecules in a portion of the blocking layer BL located directly above the second material M2 are crosslinked. On the other hand, molecules in another portion of the blocking layer BL are not activated and remain non-crosslinked. That is, part of the blocking layer BL turns into a crosslinked portion CP and another part of the blocking layer BL forms a non-crosslinked portion NP. As illustrated in FIG. 3C, the non-crosslinked portion CP covers the first material M1 and the crosslinked portion CP covers the second material M2.

Figure 3D:
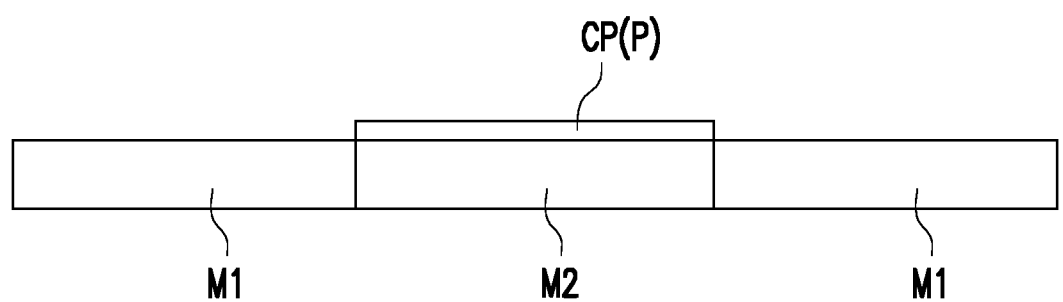

Referring to FIG. 3C and FIG. 3D, the non-crosslinked portion NP located directly above the first material M1 is removed to render a pattern P over the second material M2.

That is, the crosslinked portion CP of the blocking layer BL left on the second material M2 forms the pattern P. In some embodiments, the non-crosslinked portion NP of the blocking layer BL is removed through a wet cleaning process. In some embodiments, a cleaning solution utilized in the wet cleaning process includes propylene glycol methyl ether acetate (PGMEA), methyl ethyl ketone (MEK), isopropyl alcohol (IPA), or any other alcohol solvents. In some embodiments, with the aid of the blocking layer BL, the pattern P may be easily formed on a designated location. Since the blocking layer BL is formed through spin-coating, the complexity of using vapor deposition or soaking process may be eliminated, thereby simplifying the pattern forming process. In addition, as mentioned above, the first material M1 and the second material M2 may have the same or similar surface energies. As such, a surface treatment process on the first material M1 and the second material M2 for creating distinct surface energies may be omitted, thereby speeding up the pattern forming process. Moreover, with the aid of the blocking layer BL, selective deposition may be enabled on a broader class of materials. Furthermore, since the activation region of the blocking layer BL is determined by the underlying target material, the location precision of the target pattern P may be ensured. In other words, overlay issues, edge placement errors, or pattern collapse problems seen in conventional lithography can be eliminated, thereby rendering high quality patterns P.

Figure 4A:
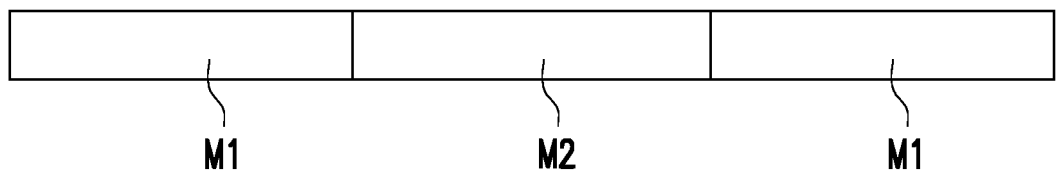
FIG. 4A to FIG. 4E are schematic cross-sectional views illustrating a method for forming a pattern in accordance with some alternative embodiments of the disclosure.

FIG. 4A to FIG. 4E are schematic cross-sectional views illustrating a method for forming a pattern P in accordance with some alternative embodiments of the disclosure. The elements presented in FIG. 4A to FIG. 4E similar to the elements shown in FIG. 3A to FIG. 3D may be denoted by the same reference numeral as labelled in FIG. 3A to FIG. 3D. Referring to FIG. 4A, the step illustrated in FIG. 4A is similar to the steps illustrated in FIG. 3A, so the detailed description thereof is omitted herein.

Figure 4B:
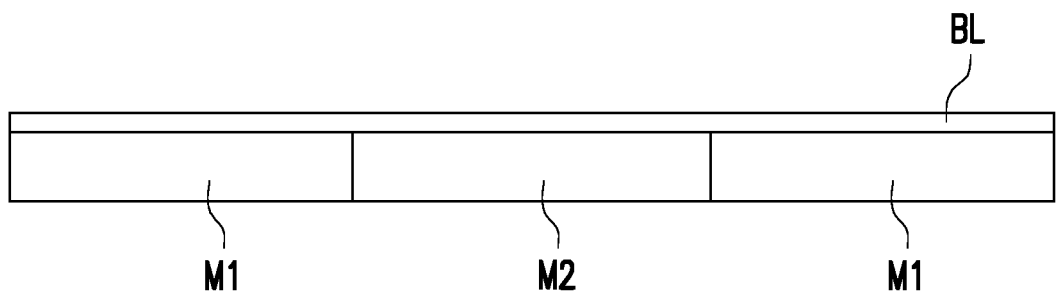

Referring to FIG. 4B, a blocking layer BL is formed over the first material M1 and the second material M2. In some embodiments, the blocking layer BL conformally and fully covers the first material M1 and the second material M2. In some embodiments, a material of the blocking layer BL includes a complex compound. In some embodiments, the complex compound has a metal core with organic ligands. The metal core may include aluminum, titanium, copper, nickel, gold, silver, tungsten, ruthenium, molybdenum, manganese, zirconium, hafnium, alloys thereof, and/or the like. On the other hand, the organic ligand includes, for example, benzoic acids, sulfonic acids, methyl methacrylates, or the like. However, the disclosure is not limited thereto. In some alternative embodiments, the complex compound has a metal oxide core with organic ligands. Examples of the metal oxide core include $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or the like. In some embodiments, the blocking layer BL further includes a cross-linking agent. The cross-linking agent includes cross-linkers with double bonds. In some embodiments, examples of the cross-linker include Bis(2-methacryloyl)oxyethyl disulfide, 1,4-Bis(4-vinylphenoxy)butane, Divinylbenzene, p-Divinylbenzene, 2-[8-(3-Hexyl-2,6-dioctylcyclohexyl)octyl] pyromellitic diimide oligomer, 11-Maleimidoundecanoic acid, 1,4-Phenylenediacryloyl chloride, Poly(ethylene glycol) diacrylate, 1,3,5-Triallyl-1,3,5-triazine-2,4,6(1H,3H, 5H)-trione, Triethylene glycol dimethacrylate, and 4-Vinylbenzocyclobutene. In some embodiments, the blocking layer BL is cross-linkable. In some embodiments, the blocking layer BL is formed on the first material M1 and the second material M2 through spin coating. In some embodiments, the blocking layer BL is formed to have a thickness of 20 nm to 200 nm.

Figure 4C:
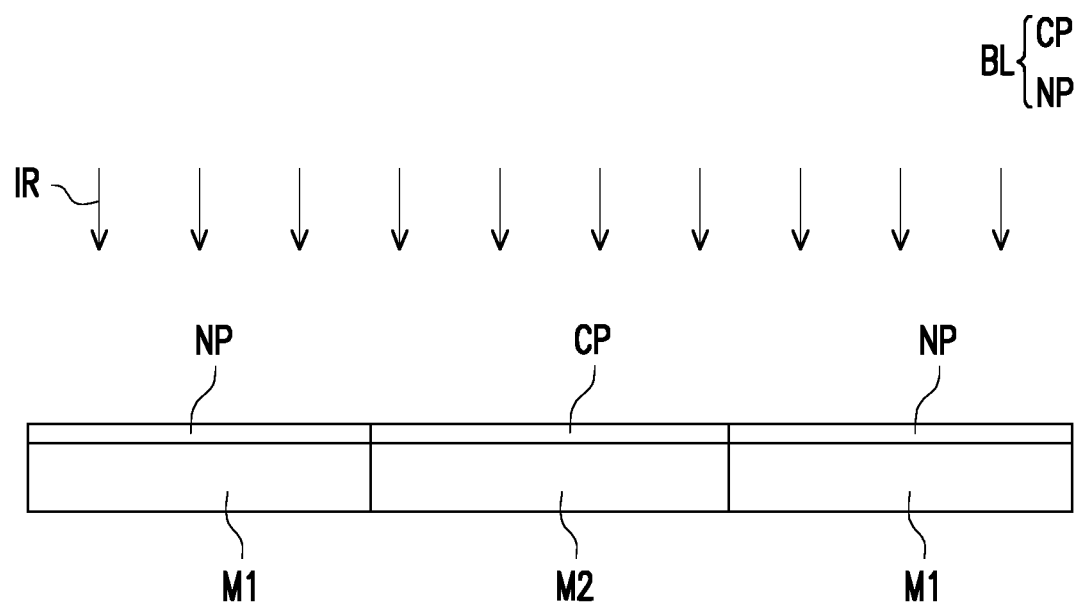

Referring to FIG. 4C, an irradiation process IR is performed on the blocking layer BL. The irradiation process IR in FIG. 4C is similar to the irradiation IR in FIG. 3C, so the detailed description thereof is omitted herein. As illustrated in FIG. 4C, the non-crosslinked portion CP covers the first material M1 and the crosslinked portion CP covers the second material M2.

Figure 4D:
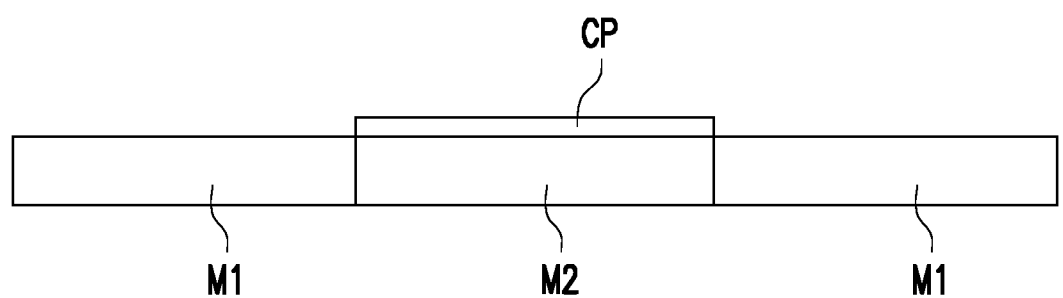

Referring to FIG. 4C and FIG. 4D, the non-crosslinked portion NP located directly above the first material M1 is removed. In some embodiments, the non-crosslinked portion NP of the blocking layer BL is removed through a wet cleaning process. In some embodiments, a cleaning solution utilized in the wet cleaning process includes propylene glycol methyl ether acetate (PGMEA), methyl ethyl ketone (MEK), isopropyl alcohol (IPA), or any other alcohol solvents.

Figure 4E:
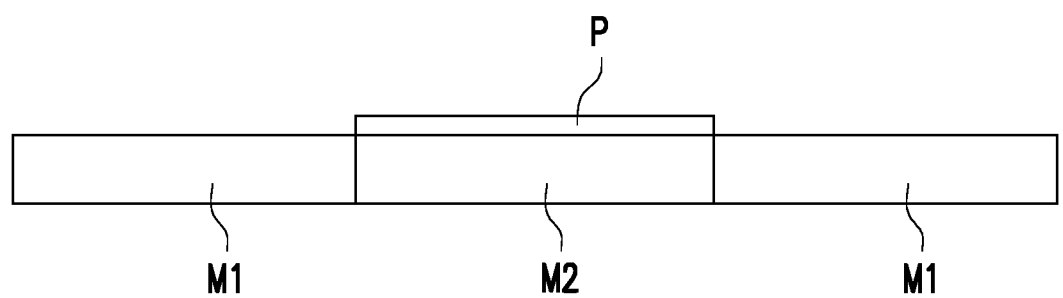

Referring to FIG. 4D and FIG. 4E, the organic ligands in the crosslinked portion CP of the blocking layer BL are removed to render the pattern P over the second material M2. In some embodiments, when the blocking layer BL has the metal core, the remaining pattern P may be a metal pattern. On the other hand, when the blocking layer BL has the metal oxide core, the remaining pattern P may be a metal oxide pattern. In some embodiments, the organic ligands in the crosslinked portion CP of the blocking layer BL may be removed through a plasma ashing process. For example, ozone, oxygen plasma, or remote oxygen plasma may be applied to remove the organic ligands. In some embodiments, with the aid of the blocking layer BL, the pattern P may be easily formed on a designated location. For example, since the blocking layer BL is directly deposited onto the first material M1 and the second material M2, the conventional step of forming a seed layer when plating conductive pattern may be omitted. Also, since the blocking layer BL is formed through spin-coating, the complexity of using vapor deposition or soaking process may be eliminated, thereby simplifying the pattern forming process. In addition, as mentioned above, the first material M1 and the second material M2 may have the same or similar surface energies. As such, a surface treatment process on the first material M1 and the second material M2 for creating distinct surface energies may be omitted, thereby speeding up the pattern forming process. Moreover, with the aid of the blocking layer BL, selective deposition may be enabled on a broader class of materials. Furthermore, since the activation region of the blocking layer BL is determined by the underlying target material, the location precision of the target pattern P may be ensured. In other words, overlay issues, edge placement errors, or pattern collapse problems seen in conventional lithography can be eliminated, thereby rendering high quality patterns P.

Figure 5A:
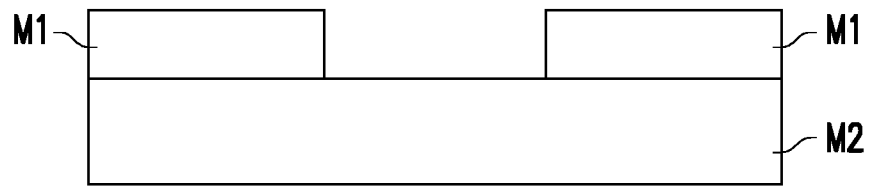
FIG. 5A to FIG. 5E are schematic cross-sectional views illustrating a method for forming a pattern in accordance with some alternative embodiments of the disclosure.

FIG. 5A to FIG. 5E are schematic cross-sectional views illustrating a method for forming a pattern P in accordance with some alternative embodiments of the disclosure. The elements presented in FIG. 5A to FIG. 5E similar to the elements shown in FIG. 4A to FIG. 4E may be denoted by the same reference numeral as labelled in FIG. 4A to FIG. 4E. Referring to FIG. 5A, a first material M1 and a second material M2 are provided. In some embodiments, the first material M1 is located on the second material M2 and partially exposes the second material M2. In some embodiments, the first material M1 is directly in contact with the second material M2. The first material M1 and the second material M2 may be similar to the first material M1 and the second material M2 in FIG. 1A and FIG. 4A, so the detailed descriptions thereof are omitted herein.

Figure 5B:
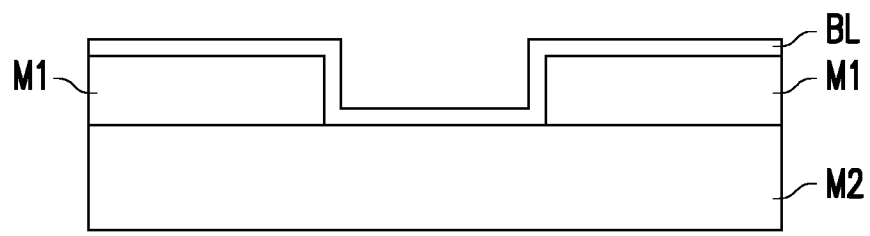

Referring to FIG. 5B, a blocking layer BL is formed over the first material M1 and the second material M2. In some embodiments, the blocking layer BL conformally covers the first material M1 and the second material M2. The blocking layer BL in FIG. 5B is similar to the blocking layer BL in FIG. 4B, so the detailed description thereof is omitted herein.

Figure 5C:
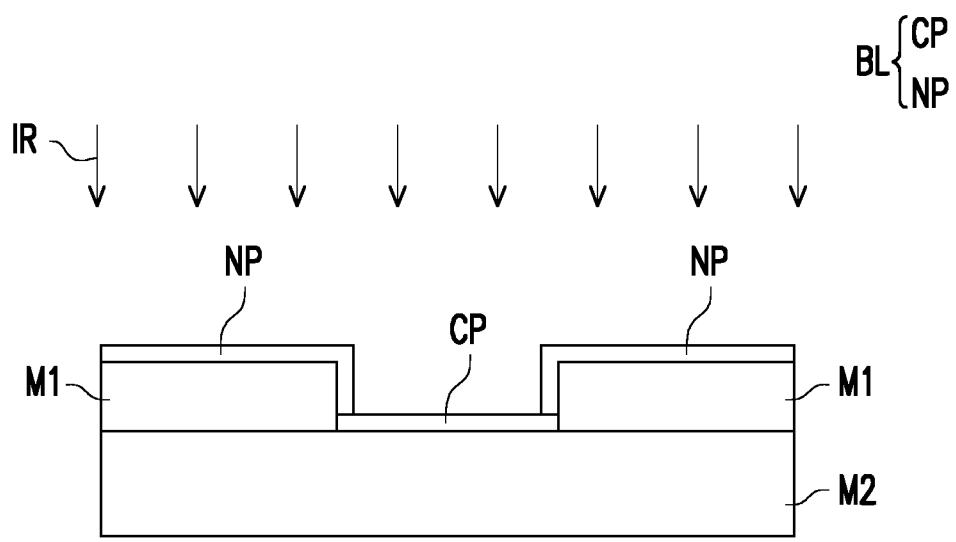

Referring to FIG. 5C, an irradiation process IR is performed on the blocking layer BL. The irradiation process IR in FIG. 5C is similar to the irradiation IR in FIG. 4C, so the detailed description thereof is omitted herein. As illustrated in FIG. 5C, the non-crosslinked portion CP covers a top surface and portions of a sidewall of the first material M1. On the other hand, the crosslinked portion CP covers the second material M2 exposed by the first material M1.

Figure 5D:
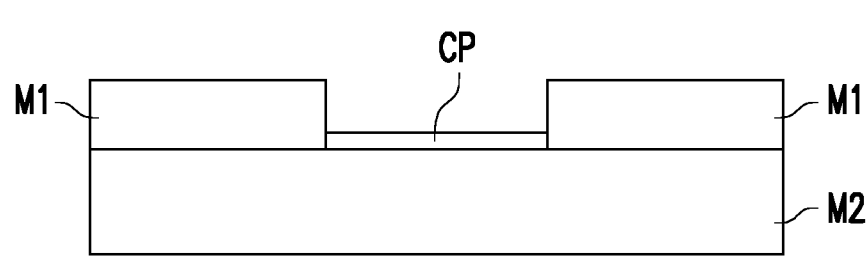
Figure 5E:
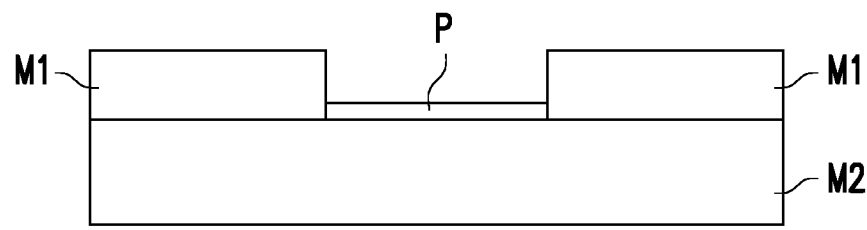

Referring to FIG. 5D and FIG. 5E, the steps illustrated in FIG. 5D to FIG. 5E are similar to the steps illustrated in FIG. 4D and FIG. 4E, so the detailed descriptions thereof is omitted herein. As illustrated in FIG. 5E, a pattern P is formed in the opening of the first material M1. That is, the pattern P is formed on the second material M2. In some embodiments, with the aid of the blocking layer BL, the pattern P may be easily formed on a designated location. For example, since the blocking layer BL is directly deposited onto the first material M1 and the second material M2, the conventional step of forming a seed layer when plating conductive pattern may be omitted. Also, since the blocking layer BL is formed through spin-coating, the complexity of using vapor deposition or soaking process may be eliminated, thereby simplifying the pattern forming process. In addition, as mentioned above, the first material M1 and the second material M2 may have the same or similar surface energies. As such, a surface treatment process on the first material M1 and the second material M2 for creating distinct surface energies may be omitted, thereby speeding up the pattern forming process. Moreover, with the aid of the blocking layer BL, selective deposition may be enabled on a broader class of materials. Furthermore, since the activation region of the blocking layer BL is determined by the underlying target material, the location precision of the target pattern P may be ensured. In other words, overlay issues, edge placement errors, or pattern collapse problems seen in conventional lithography can be eliminated, thereby rendering high quality patterns P.

In some embodiments, the pattern forming methods illustrated in FIG. 1A to FIG. 1F, FIG. 2A to FIG. 2F, FIG. 3A to FIG. 3D, FIG. 4A to FIG. 4E, and FIG. 5A to FIG. 5E may be adapted in various applications. For example, these methods may be adapted to form seed layers, routing layers, dielectric layers, barrier layers, liner layers, or the like in electronic devices. In some embodiments, these pattern forming methods may be utilized in forming conductive features and/or dielectric features in a package. For example, the conductive patterns and dielectric patterns in an interconnection structure within a die of the package or conductive patterns and dielectric patterns in a redistribution structure of the package may be formed by these methods. Alternatively, these pattern forming methods may also be utilized in forming semiconductor features, conductive features, and/or dielectric features in a field effect transistor (FET). For example, poly gates, metallic gates, gate dielectric layers, spacers, gate contacts of a FET may be formed by these methods. It should be noted that the elements listed above merely serve as an exemplary illustration, and the disclosure is not limited thereto. The pattern forming methods shown above may also be suitable in forming any other patterns. The adaption of the foregoing pattern forming methods in a redistribution structure of a package is exemplified below.

Figure 6A:
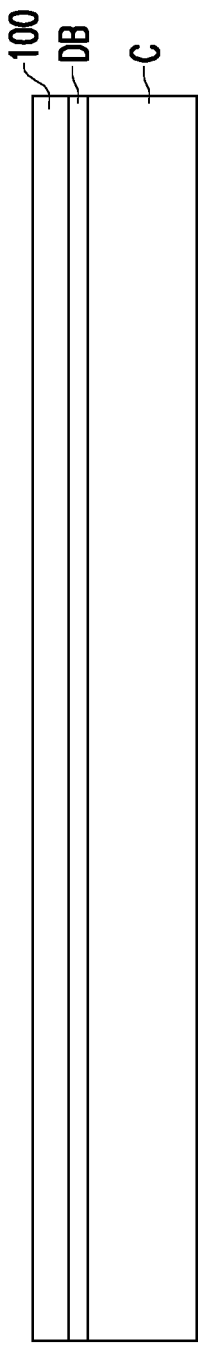
FIG. 6A to FIG. 6W are schematic cross-sectional views illustrating a manufacturing process of a package in accordance with some embodiments of the disclosure.
Figure 6B:
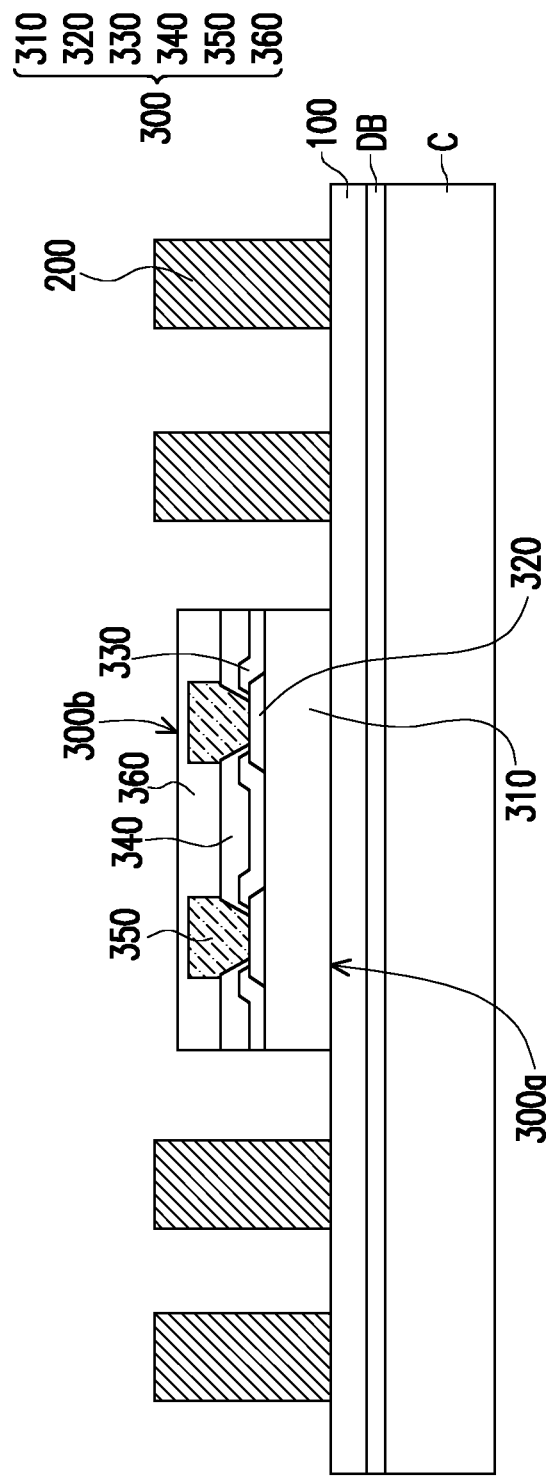
Figure 6I:
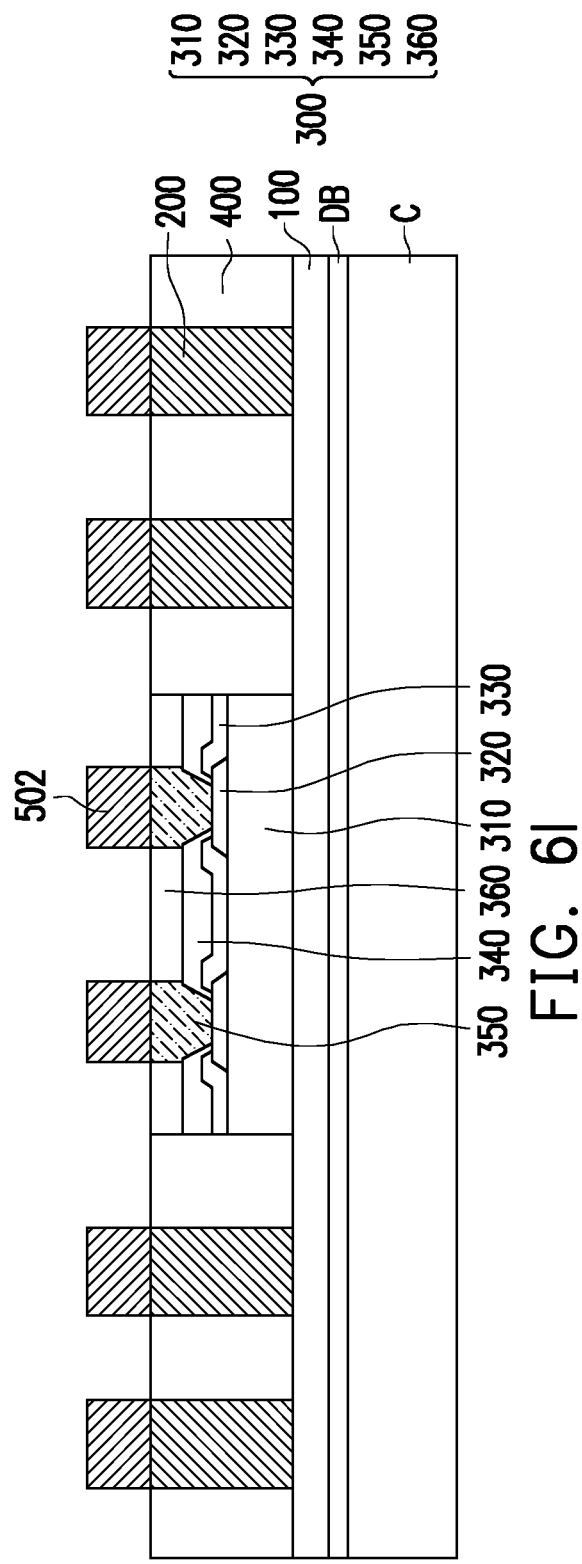
Figure 6J:
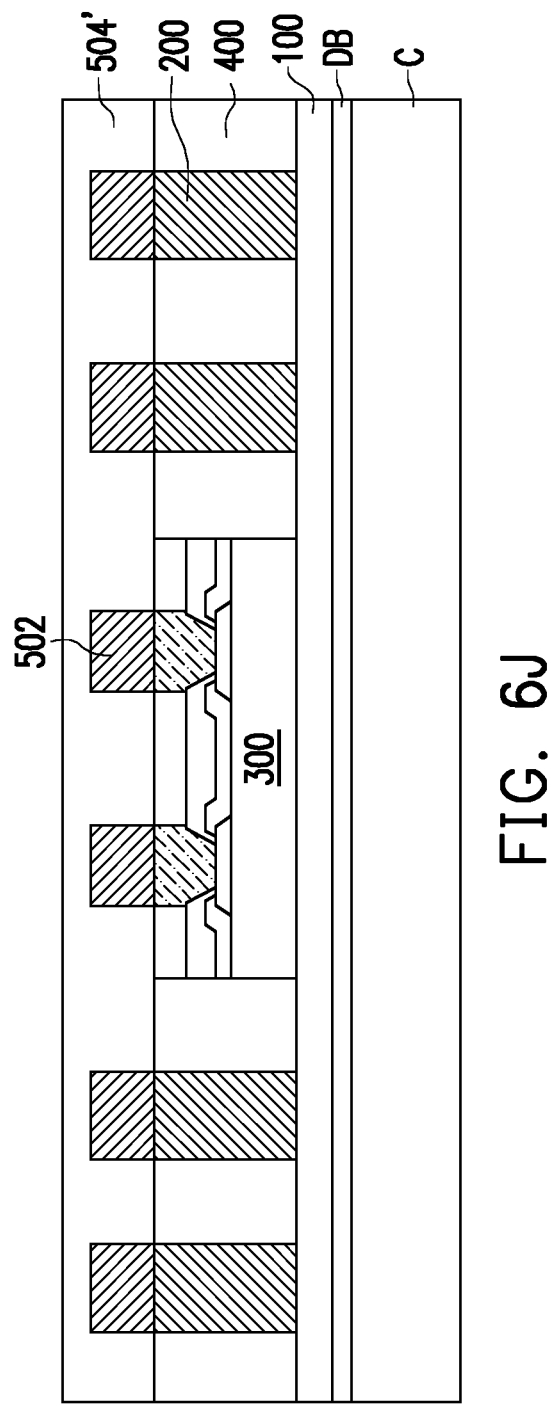
Figure 6K:
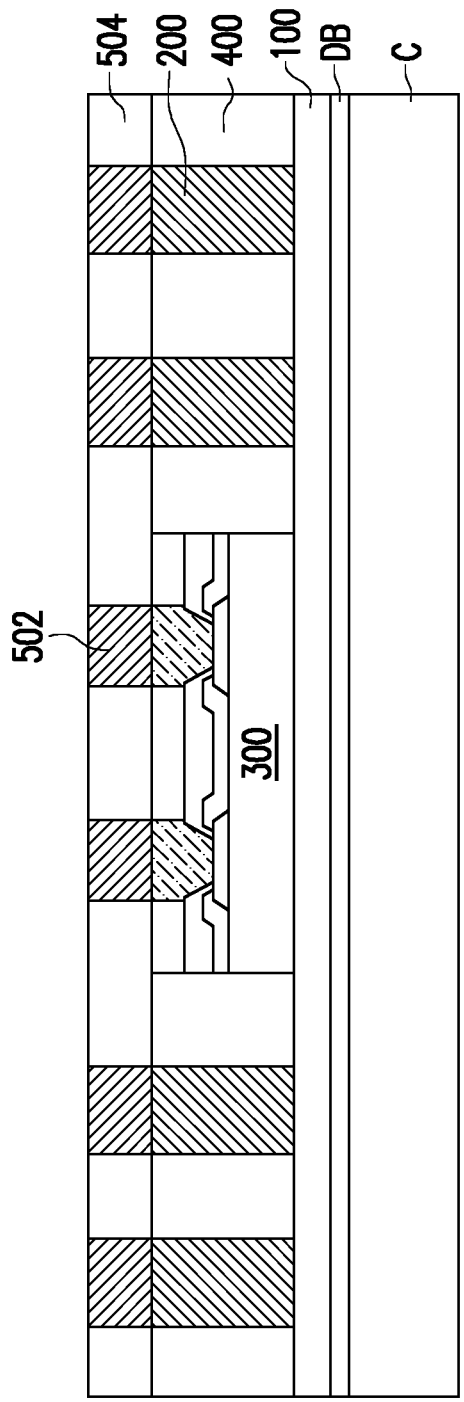
Figure 6L:
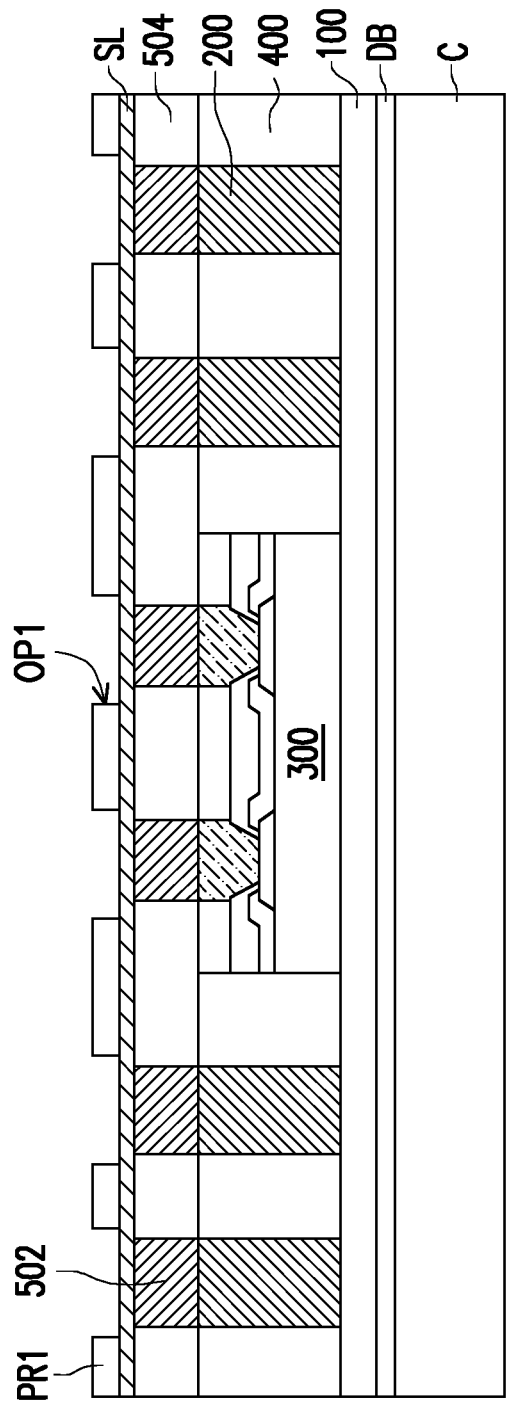
Figure 6M:
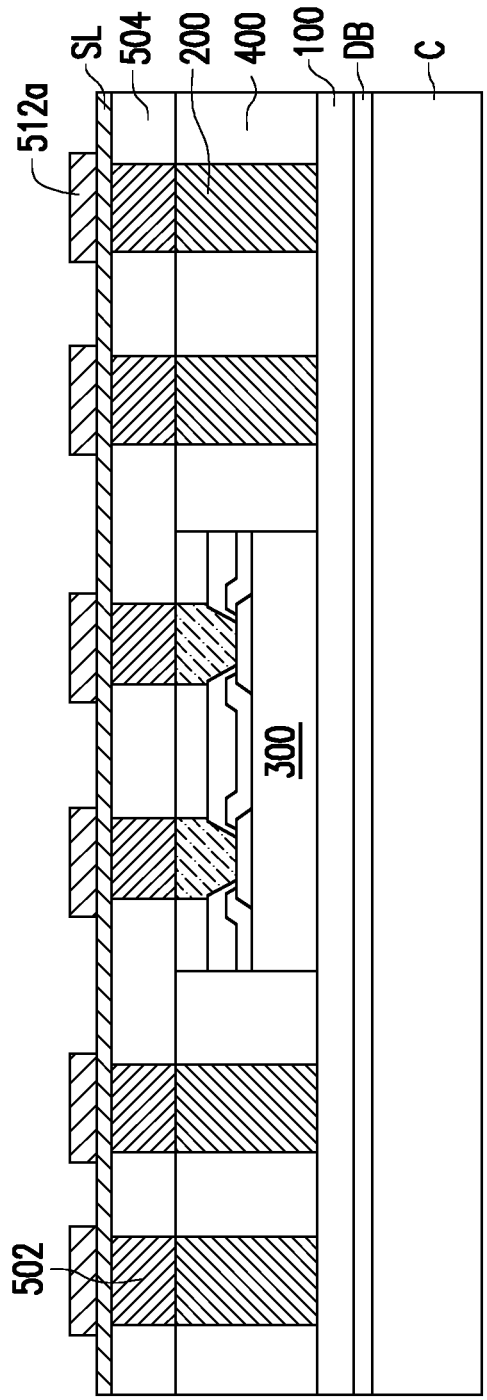
Figure 6N:
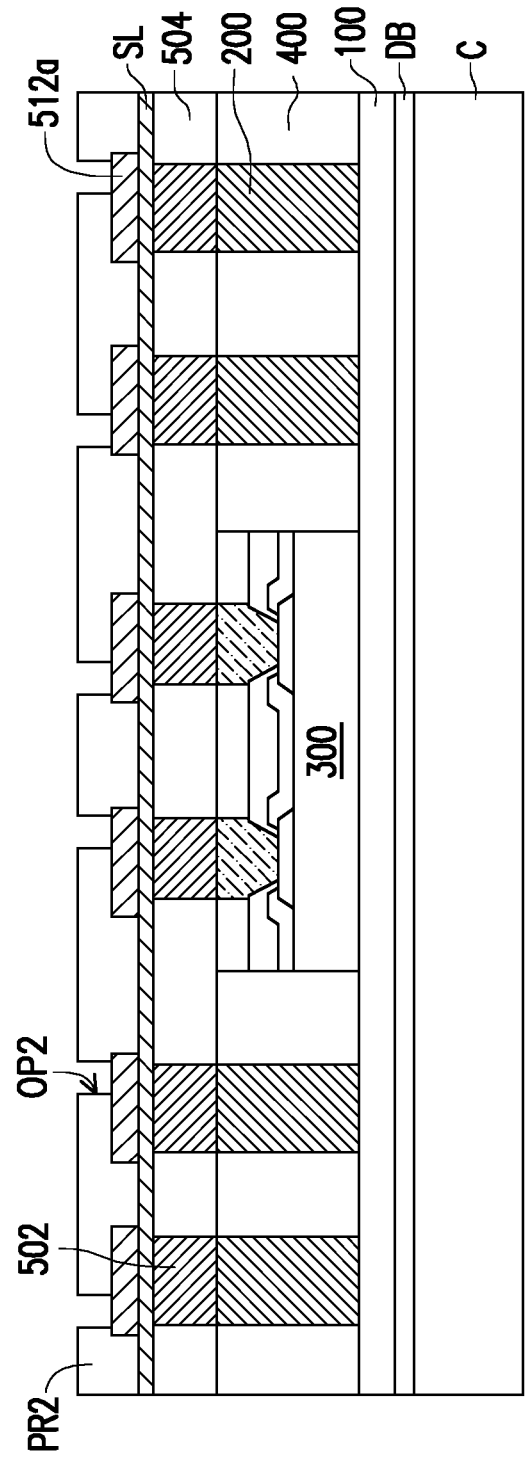
Figure 6O:
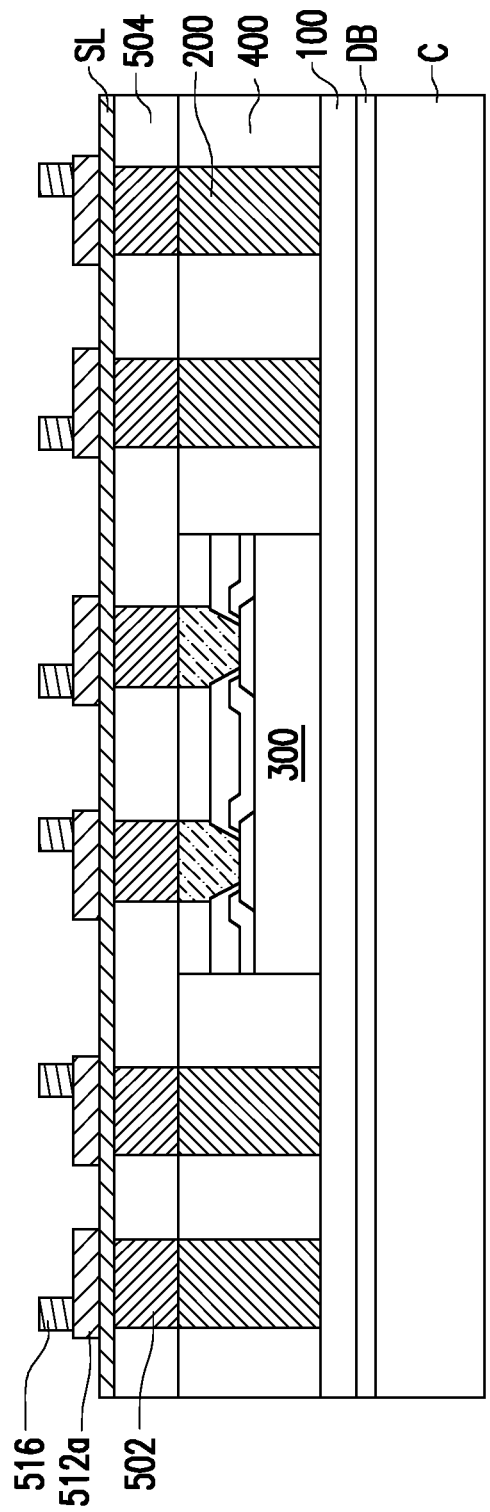
Figure 6P:
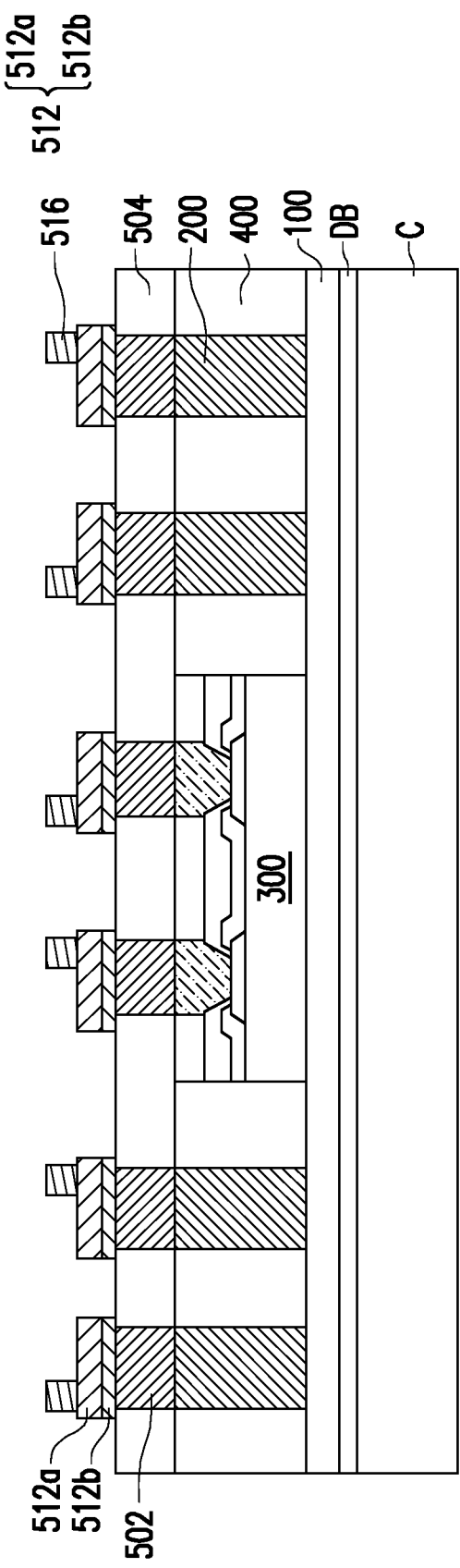
Figure 6Q:
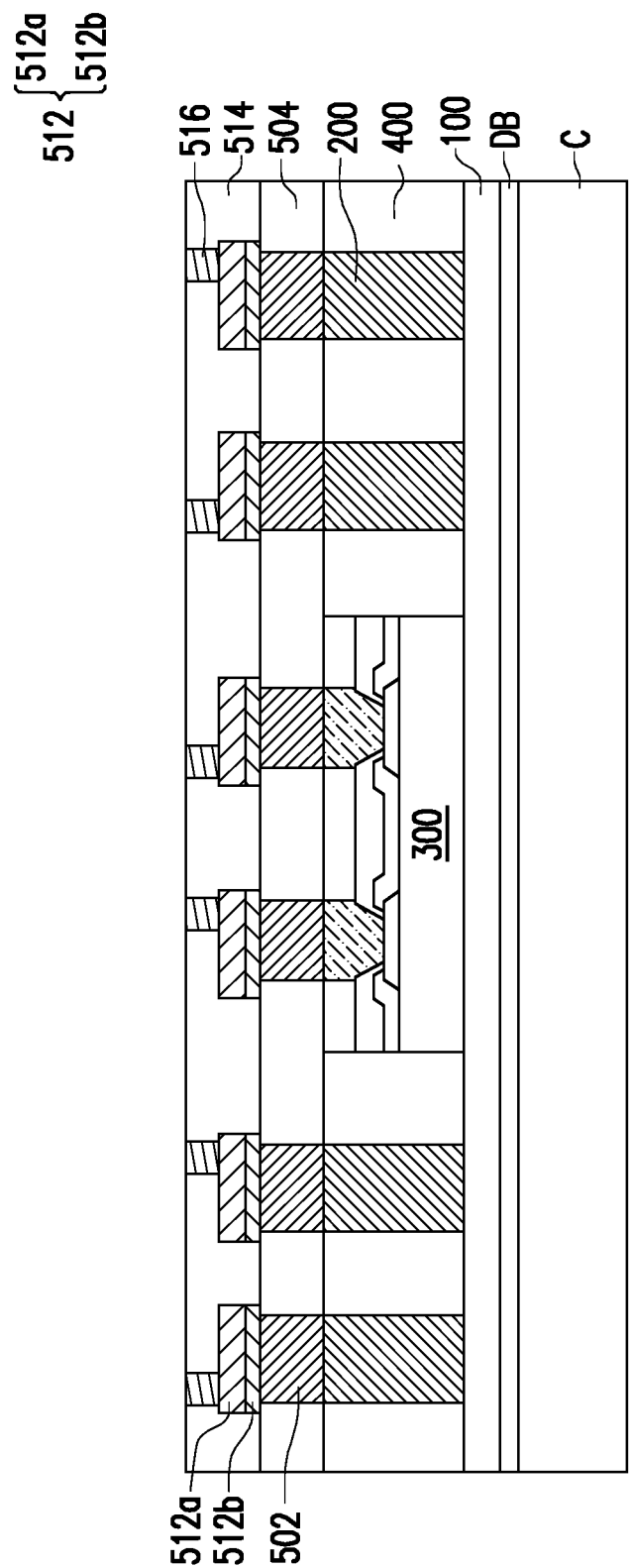
Figure 6R:
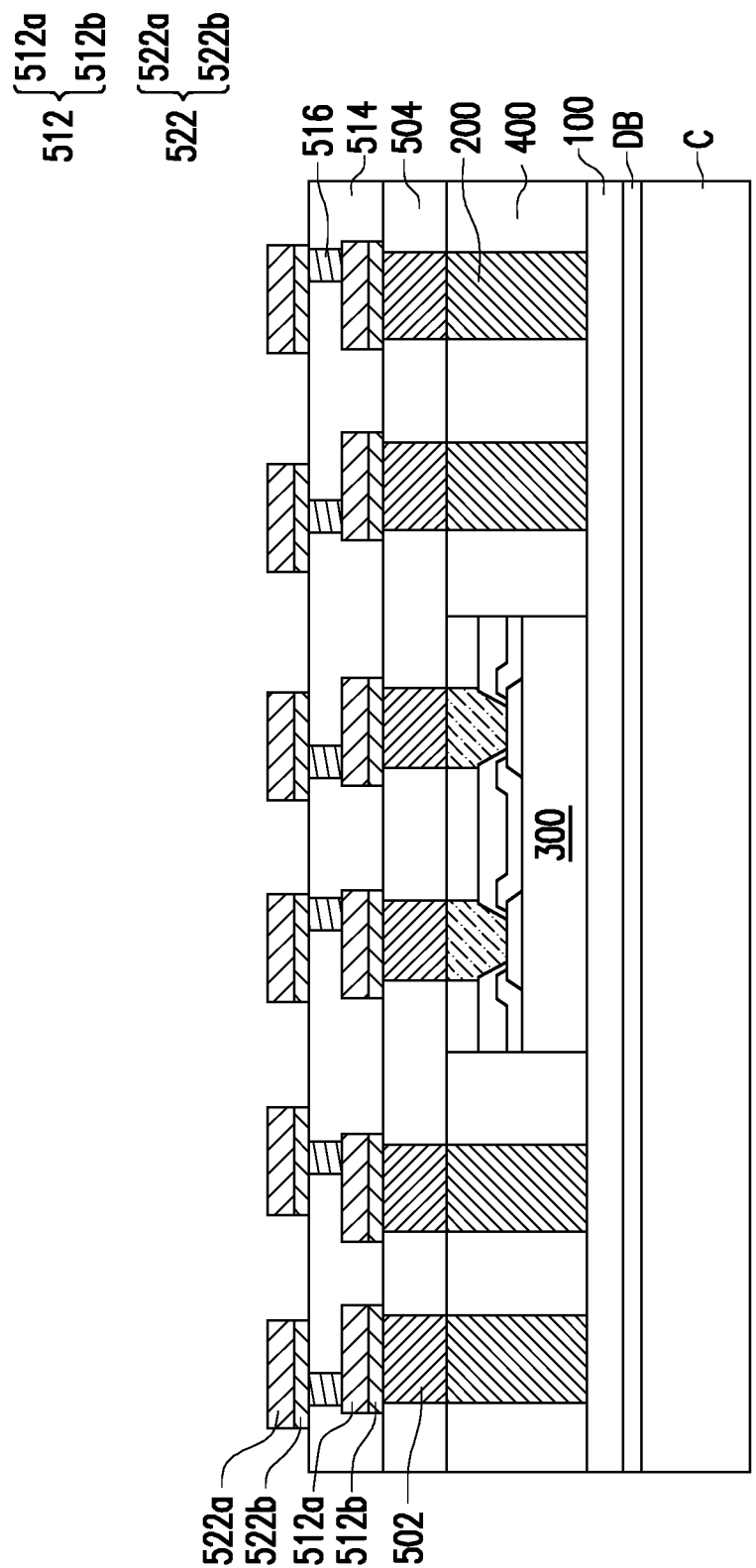
Figure 6S:
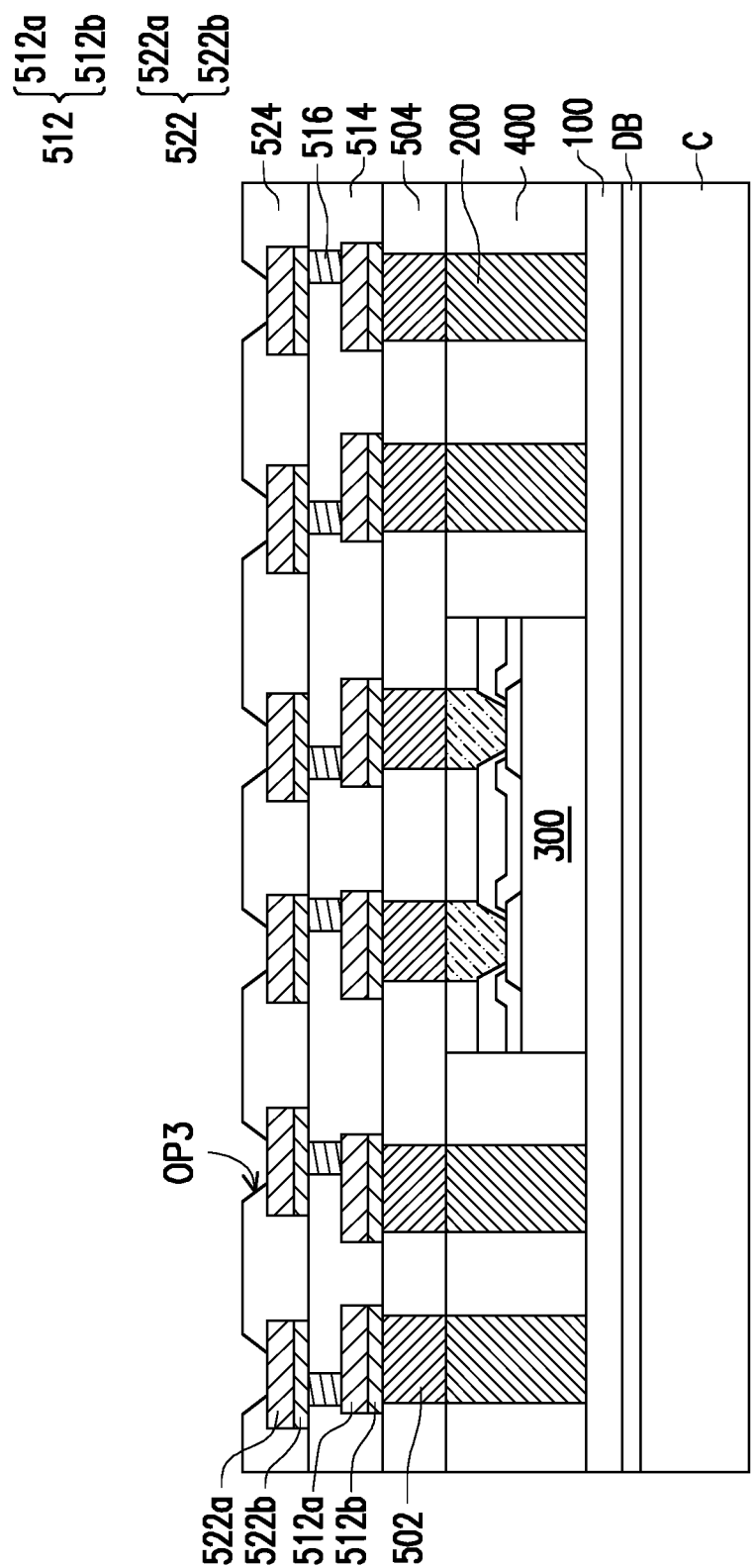
Figure 6T:
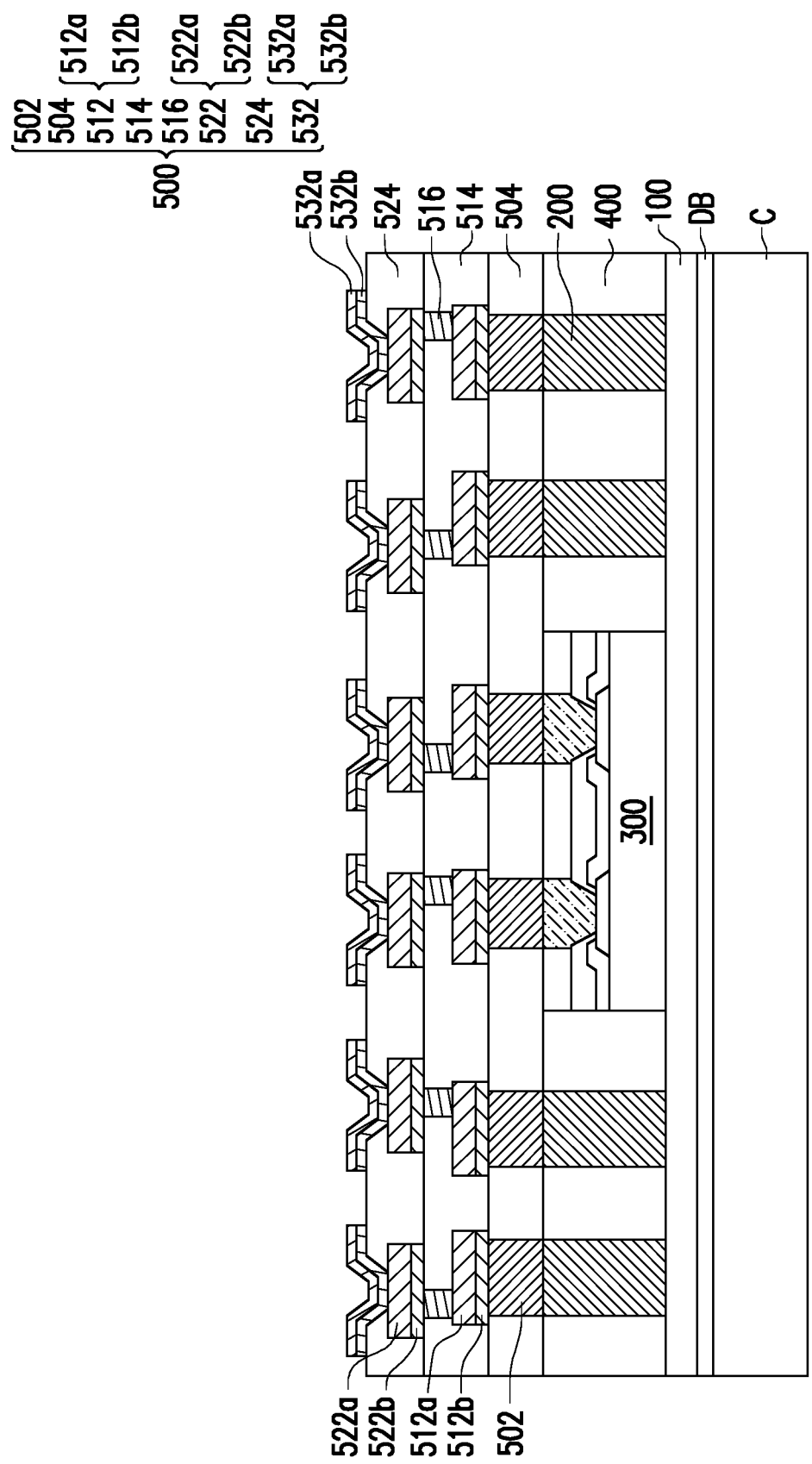
Figure 6U:
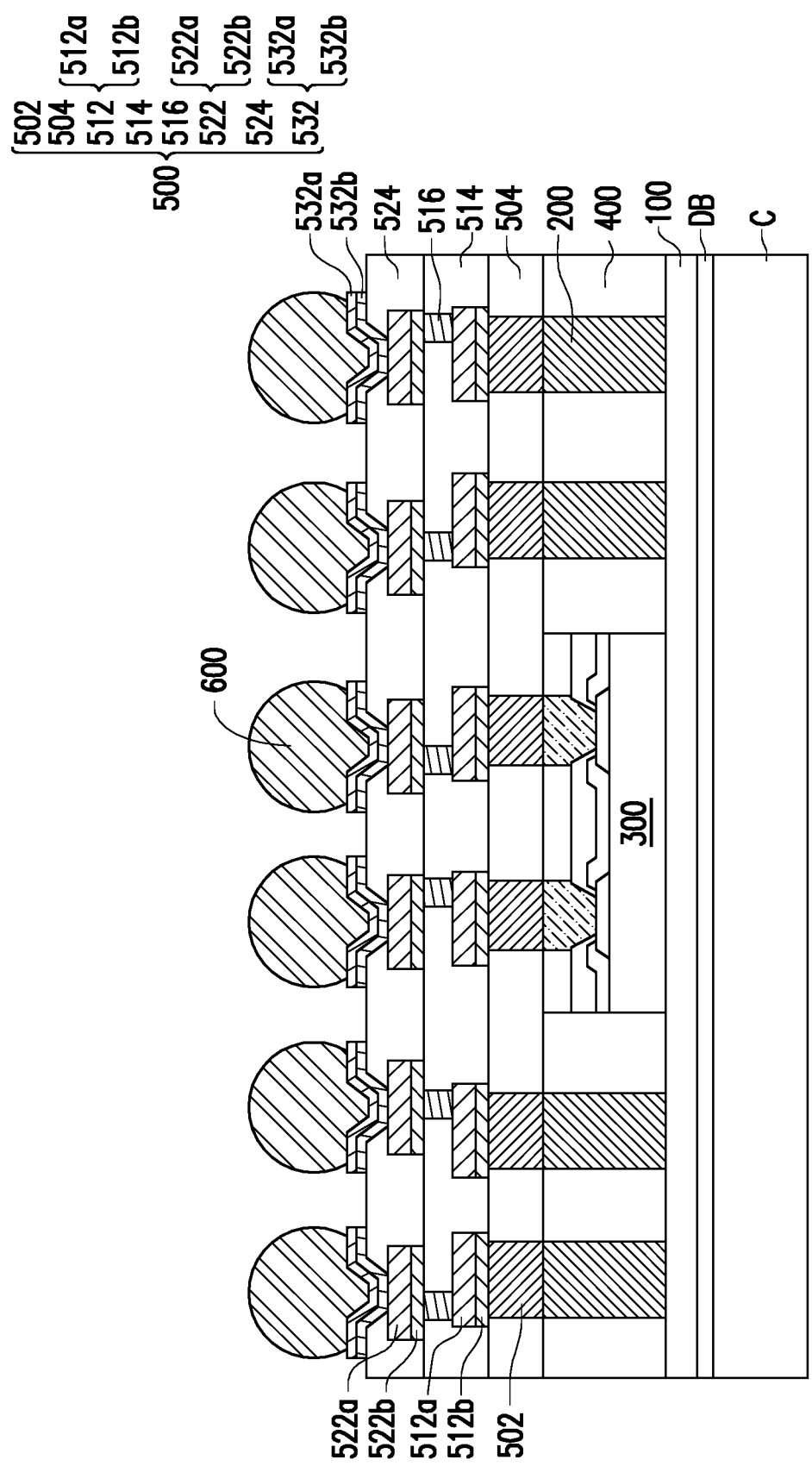
Figure 6V:
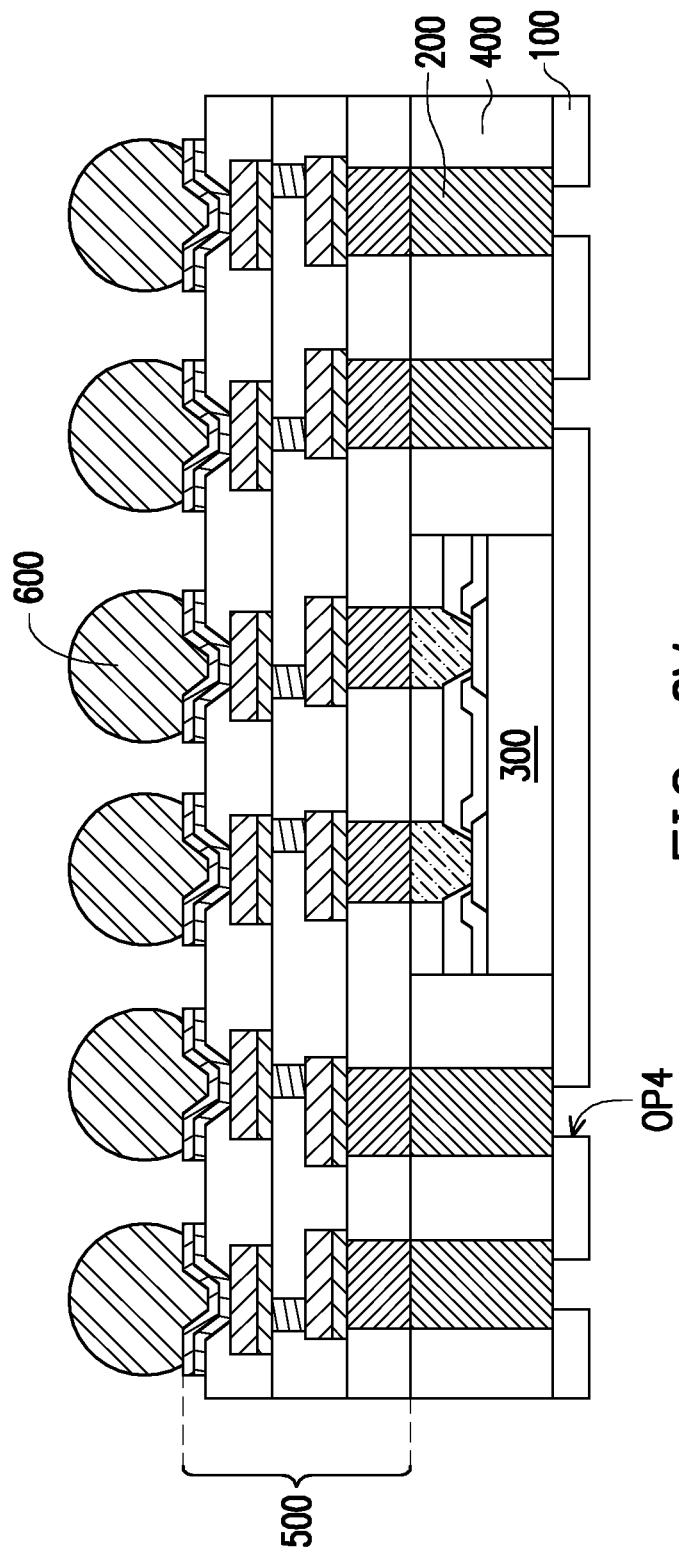
Figure 6W:
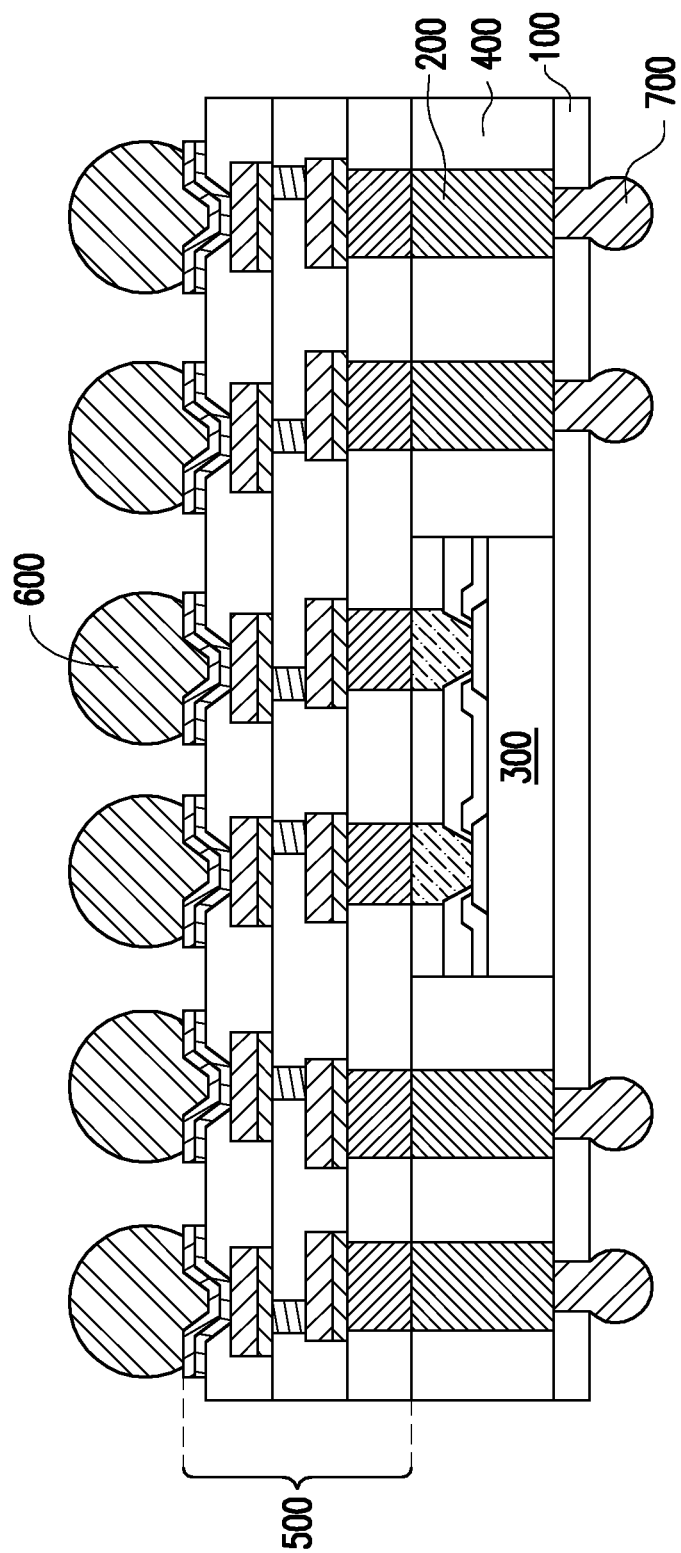

FIG. 6A to FIG. 6W are schematic cross-sectional views illustrating a manufacturing process of a package 10 in accordance with some embodiments of the disclosure. Referring to FIG. 6A, a carrier C having a de-bonding layer DB and a dielectric layer 100 stacked thereon is provided. In some embodiments, the de-bonding layer DB is formed on the upper surface of the carrier C, and the de-bonding layer DB is between the carrier C and the dielectric layer 100. For example, the carrier C may be a glass substrate and the de-bonding layer DB may be a light-to-heat conversion (LTHC) release layer formed on the glass substrate. However, the disclosure is not limited thereto, and other suitable materials may be adapted for the carrier C and the de-bonding layer DB. In some embodiments, a material of the dielectric layer 100 includes polyimide (PI), epoxy resin, acrylic resin, phenol resin, benzocyclobutene (BCB), polybenzoxazole (PBO), or any other suitable polymer-based dielectric material. The dielectric layer 100, for example, may be formed by suitable fabrication techniques such as spin-on coating, chemical vapor deposition (CVD), plasma-enhanced chemical vapor deposition (PECVD), or the like.

Referring to FIG. 6B, a plurality of conductive structures 200 and a die 300 are formed over the dielectric layer 100. In some embodiments, the die 300 is picked and placed onto the dielectric layer 100. The die 300, for example, includes a semiconductor substrate 310, a plurality of conductive pads 320, a passivation layer 330, a post-passivation layer 340, a plurality of metallic posts 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed by the contact openings of the post-passivation layer 340. The post-passivation layer 340 may be a PI layer, a PBO layer, or a dielectric layer formed by other suitable polymers. In addition, the metallic posts 350 are formed on the conductive pads 320. In some embodiments, the metallic posts 350 are plated on the conductive pads 320. The protection layer 360 is formed on the post-passivation layer 340 to cover the metallic posts 350.

As illustrated in FIG. 6B, the die 300 has a rear surface 300a and a front surface 300b opposite to the rear surface 300a. In some embodiments, the rear surface 300a of the die 300 is attached (or adhered) to the dielectric layer 100 through a die attach film (DAF; not shown). On the other hand, the front surface 300b of the die 300 faces upward and is exposed. Although one die 300 is illustrated in FIG. 6B, it construes no limitation in the disclosure. In some alternative embodiments, more than one dies 300 may be picked and placed onto the dielectric layer 100.

The conductive structures 200 are formed to surround the die 300. In some embodiments, the method of forming the conductive structures 200 includes the following steps. First, a seed material layer (not shown) is formed over the dielectric layer 100. In some embodiments, the seed material layer includes a titanium/copper composite layer formed by a sputtering process. Subsequently, a photoresist layer (not shown) with openings is formed on the seed material layer. The openings of the photoresist layer expose the intended locations for the subsequently formed conductive structures 200. Thereafter, a plating process is performed to form a metal material layer (e.g., a copper layer) on the seed material layer exposed by the openings of the photoresist layer. The photoresist layer and the underlying seed material layer are then removed to form the conductive structures 200. However, the disclosure is not limited thereto. In some alternative embodiments, the conductive structures 200 may be formed by pick and place pre-fabricated conductive structures onto the dielectric layer 100.

Referring to FIG. 6C, an encapsulation material 400' is formed on the dielectric layer 100 to encapsulate the conductive structure 200 and the die 300. The conductive structures 200 and the protection layer 360 of the die 300 are encapsulated by the encapsulation material 400'. In other words, the conductive structures 200 and the protection layer 360 of the die 300 are not revealed and are well protected by the encapsulation material 400'. In some embodiments, the encapsulation material 400' includes a molding compound, a molding underfill, a resin (such as epoxy), or the like. The encapsulation material 400' may be formed by a molding process, such as a compression molding process.

Referring to FIG. 6C and FIG. 6D, the encapsulation material 400' and the protection layer 360 of the die 300 are grinded until top surfaces of the metallic posts 350 are exposed. After the encapsulation material 400' is grinded, an encapsulant 400 is formed over the dielectric layer 100 to encapsulate the die 300 and the conductive structures 200. In some embodiments, the encapsulant material 400' is grinded by a mechanical grinding process and/or a chemical mechanical polishing (CMP) process. In some embodiments, during the grinding process of the encapsulant material 400', the protection layer 360 is grinded to reveal the metallic posts 350. In some embodiments, portions of the metallic posts 350 and portions of the conductive structures 200 are slightly grinded as well. After grinding, the die 300 has an active surface 300c and a rear surface 300a opposite to the active surface 300c. The exposed portion of the metallic posts 350 is located on the active surface 300c of the die 300. In some embodiments, the encapsulant 400 encapsulates sidewalls of the die 300. In some embodiments, the encapsulant 400 is penetrated by the conductive structures 200. It is noted that top surfaces of the conductive structures 200, a top surface of the protection layer 360, and top surfaces of the metallic posts 350 are substantially coplanar with a top surface of the encapsulant 400.

Referring to FIG. 6E to FIG. 6I, a plurality of conductive patterns 502 are formed on the metallic posts 350 and the conductive structures 200 through the pattern forming method illustrated in FIG. 1A to FIG. 1F. Referring to FIG. 6E, a blocking layer BL is formed over the metallic posts 350, the conductive structures 200, the protection layer 360, and the encapsulant 400. In some embodiments, the protection layer 360 and the encapsulant 400 correspond to the first material M1 in FIG. 1A to FIG. 1F. On the other hand, the metallic posts 350 and the conductive structures 200 correspond to the second material M2 in FIG. 1A to FIG. 1F. For example, radiation absorptions rates of the protection layer 360 and the encapsulant 400 are greater than radiation absorption rates of the metallic posts 350 and the conductive structures 200. In some embodiments, the blocking layer BL in FIG. 6E is similar to the blocking layer BL in FIG. 1B, so the detailed description thereof is omitted herein.

Referring to FIG. 6F, an irradiation process IR is performed on the blocking layer BL. During the irradiation process IR, an electromagnetic radiation is globally irradiated on the blocking BL. The irradiation process IR in FIG. 6F is similar to the irradiation process IR in FIG. 1C, so the detailed description thereof is omitted herein. In some embodiments, the radiation absorption rates of the protection layer 360 and the encapsulant 400 are greater than the radiation absorption rates of the metallic posts 350 and the conductive structures 200. As such, molecules in a portion of the blocking layer BL located directly above the protection layer 360 and the encapsulant 400 are crosslinked. On the other hand, molecules in another portion of the blocking layer BL are not activated and remain non-crosslinked. That is, part of the blocking layer BL turns into a crosslinked portion CP and another part of the blocking layer BL forms a non-crosslinked portion NP. As illustrated in FIG. 6F, the crosslinked portion CP covers the protection layer 360 and the encapsulant 400 while the non-crosslinked portion NP covers the metallic posts 350 and the conductive structures 200.

Referring to FIG. 6F and FIG. 6G, the non-crosslinked portion NP located directly above the metallic posts 350 and the conductive structures 200 is removed. Upon removal of the non-crosslinked portion NP, the top surfaces of the metallic posts 350 and the top surfaces of the conductive structures 200 are exposed by openings created by the crosslinked portion CP.

Referring to FIG. 6H, a conductive material 502' is formed over the exposed metallic posts 350 and the exposed conductive structures 200. In some embodiments, the conductive material 502' includes aluminum, titanium, copper, nickel, gold, silver, tungsten, and/or alloys thereof. In some embodiments, the conductive material 502' correspond to the third material M3 in FIG. 1E. In some embodiments, the conductive material 502' is formed by atomic layer deposition (ALD). In some embodiments, ALD process is characterized in that the materials are deposited on a polar surface and are not formed on a non-polar surface. In some embodiments, the blocking layer BL is able to create a non-polar surface while the top surfaces of the metallic posts 350 and the conductive structures 200 remain polar. As a result, the conductive material 502' is selectively formed on the metallic posts 350 and the conductive structures 200 due to the nature of ALD. In some alternative embodiments, the third material M3 is formed by directional chemical vapor deposition (directional CVD). In embodiments, during the directional CVD process, the CVD process is assisted by a plasma to create a directional deposition. With the aid of the plasma, the conductive material 502' may be precisely deposited onto the metallic posts 350 and the conductive structures 200.

Referring to FIG. 6H and FIG. 6I, the crosslinked portion CP of the blocking layer BL is removed to render the conductive patterns 502 over the metallic posts 350 and the conductive structures 200. In some embodiments, the conductive patterns 502 in FIG. 6I correspond to the pattern P in FIG. 1F. It should be noted that the processes of forming the conductive pattern 502 illustrated in FIG. 6E to FIG. 6I are merely exemplary illustration, and the disclosure is not limited thereto. In some alternative embodiments, the conductive patterns 502 may be formed by other methods. These methods will be described below in conjunction with FIG. 7A to FIG. 7B and FIG. 8A to FIG. 8C.

FIG. 7A to FIG. 7B are schematic cross-sectional views illustrating intermediate stages of a manufacturing process of a package 10 in accordance with some alternative embodiments of the disclosure. The process illustrated in FIG. 7A and FIG. 7B correspond to the pattern forming method presented in FIG. 2A to FIG. 2F. In some embodiments, the steps illustrated in FIG. 6H and FIG. 6I may be replaced by the steps shown in FIG. 7A and FIG. 7B. Referring to FIG. 7A, a conductive material 502' is formed over the crosslinked portion CP, the exposed metallic posts 350, and the exposed conductive structures 200. In some embodiments, the conductive material 502' includes aluminum, titanium, copper, nickel, gold, silver, tungsten, and/or alloys thereof. In some embodiments, the conductive material 502' correspond to the third material M3 in FIG. 1E. In some embodiments, the conductive material 502' is formed by chemical vapor deposition (CVD). Due to the nature of CVD, the conductive material 502' is formed to fully cover the crosslinked portion CP, the metallic posts 350, and the conductive structures 200. As illustrated in FIG. 7A, the conductive material 502' is divided into a first portion 502a and a second portion 502b. The first portion 502a is located directly above the crosslinked portion CP while the second portion 502b is located directly above the metallic posts 350 and the conductive structures 200.

Referring to FIG. 7A and FIG. 7B, the crosslinked portion CP of the blocking layer BL and the first portion 502a of the conductive material 502' are removed to render conductive patterns 502 over the metallic posts 350 and the conductive structures 200. In some embodiments, the crosslinked portion CP of the blocking layer BL and the first portion 502a are removed simultaneously. For example, the first portion 502a located directly above the crosslinked portion CP may be lifted off while the crosslinked portion CP is being removed. In some embodiments, the conductive patterns 502 in FIG. 7B correspond to the pattern P in FIG. 2F.

Figure 8A:
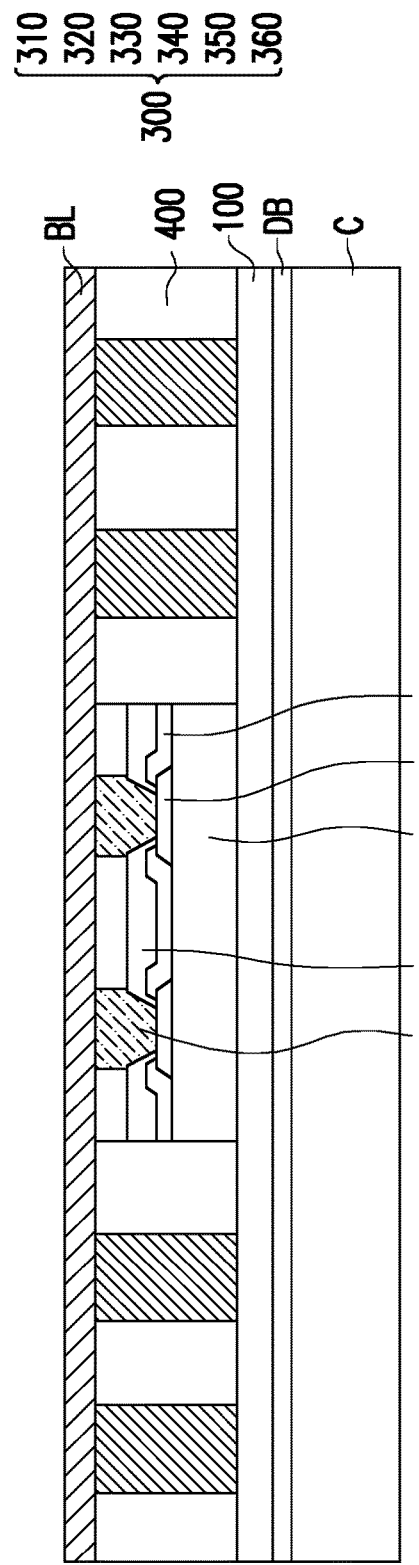
Figure 8B:
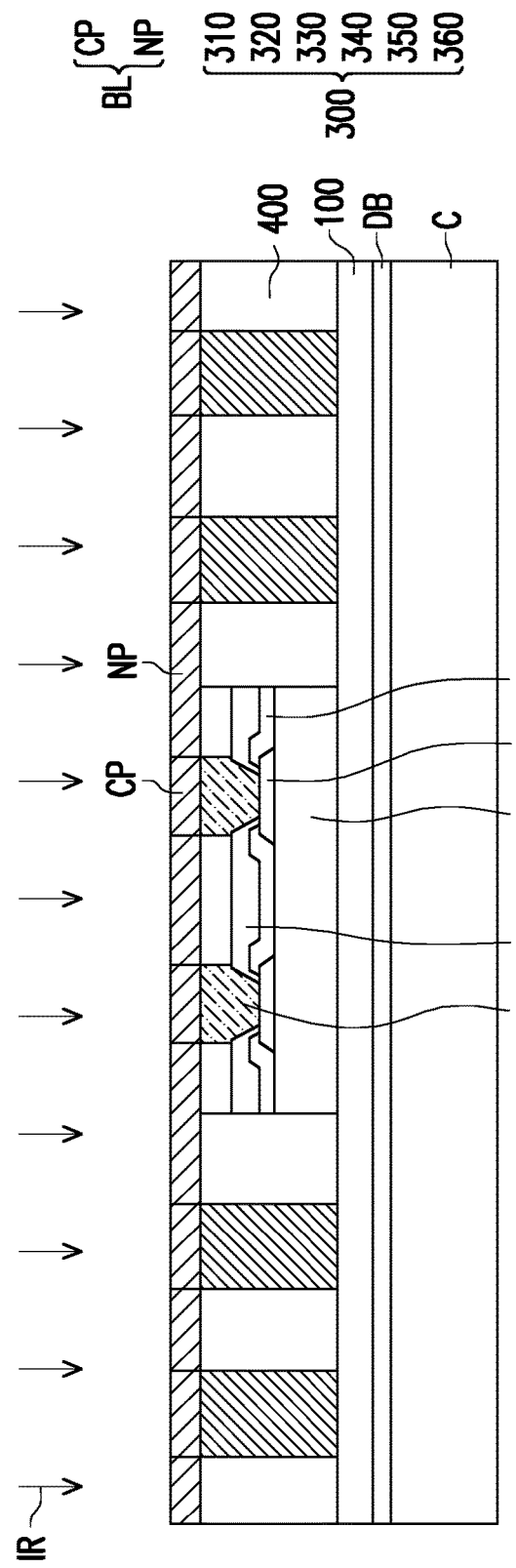

FIG. 8A to FIG. 8C are schematic cross-sectional views illustrating intermediate stages of a manufacturing process of a package 10 in accordance with some alternative embodiments of the disclosure. The process illustrated in FIG. 8A and FIG. 8C correspond to the pattern forming method presented in FIG. 4A to FIG. 4E. Referring to FIG. 8A, a blocking layer BL is formed over the metallic posts 350, the conductive structures 200, the protection layer 360, and the encapsulant 400. In some embodiments, the protection layer 360 and the encapsulant 400 correspond to the first material M1 in FIG. 4A to FIG. 4E. On the other hand, the metallic posts 350 and the conductive structures 200 correspond to the second material M2 in FIG. 4A to FIG. 4E. For example, radiation absorption rates of the metallic posts 350 and the conductive structures 200 are greater than radiation absorption rates of the protection layer 360 and the encapsulant 400. In some embodiments, a material of the blocking layer BL includes a complex compound having a metal core with organic ligands. In some embodiments, the blocking layer BL in FIG. 8A is similar to the blocking layer BL in FIG. 4B, so the detailed description thereof is omitted herein.

Referring to FIG. 8B, an irradiation process IR is performed on the blocking layer BL. During the irradiation process IR, an electromagnetic radiation is globally irradiated on the blocking BL. The irradiation process IR in FIG. 8B is similar to the irradiation process IR in FIG. 4C, so the detailed description thereof is omitted herein. In some embodiments, the radiation absorption rates of metallic posts 350 and the conductive structures 200 are greater than the radiation absorption rates of the protection layer 360 and the encapsulant 400. As such, molecules in a portion of the blocking layer BL located directly above the metallic posts 350 and the conductive structures 200 are crosslinked. On the other hand, molecules in another portion of the blocking layer BL are not activated and remain non-crosslinked. That is, part of the blocking layer BL turns into a crosslinked portion CP and another part of the blocking layer BL forms a non-crosslinked portion NP. As illustrated in FIG. 8B, the crosslinked portion CP covers the metallic posts 350 and the conductive structures 200 while the non-crosslinked portion NP covers the protection layer 360 and the encapsulant 400.

Referring to FIG. 8B and FIG. 8C, the non-crosslinked portion NP located directly above the protection layer 360 and the encapsulant 400 is removed. Subsequently, the organic ligands in the crosslinked portion CP of the blocking layer BL are removed to render the conductive patterns 502 over the metallic posts 350 and the conductive structures 200. In some embodiments, the organic ligands in the crosslinked portion CP of the blocking layer BL may be removed through a plasma ashing process. For example, ozone, oxygen plasma, or remote oxygen plasma may be applied to remove the organic ligands. In some embodiments, the conductive patterns 502 in FIG. 8C correspond to the pattern P in FIG. 4E.

Referring back to FIG. 6J, after forming the conductive patterns 502, a dielectric material layer 504' is formed over the encapsulant 400, the conductive structures 200, and the dies 300 to encapsulate the conductive patterns 502. In other words, the conductive patterns 502 are not revealed and are well protected by the dielectric material layer 504'. In some embodiments, a material of the dielectric material layer 504' includes polyimide, epoxy resin, acrylic resin, phenol resin, BCB, PBO, or any other suitable polymer-based dielectric material. The dielectric material layer 504' may be formed by suitable fabrication techniques, such as spin-on coating, chemical vapor deposition (CVD), plasma-enhanced chemical vapor deposition (PECVD), or the like.

Referring to FIG. 6J and FIG. 6K, a portion of the dielectric material layer 504' is removed to form a dielectric layer 504 exposing top surfaces of the conductive patterns 502. For example, the dielectric material layer 504' may be grinded until top surfaces of the conductive patterns 502 are exposed. In some embodiments, the dielectric material layer 504' is grinded by a chemical mechanical polishing (CMP) process. In some embodiments, the dielectric material layer 504' is grinded such that top surfaces of the conductive patterns 502 are substantially coplanar with a top surface of the dielectric layer 504. In some embodiments, the conductive patterns 502 and the dielectric layer 504 may be collectively referred to as a first sub-layer of the subsequently formed redistribution structure.

Referring to FIG. 6L, a seed material layer SL is formed over the first sub-layer. The seed material layer SL may be formed through, for example, a sputtering process, a physical vapor deposition (PVD) process, or the like. In some embodiments, the seed material layer SL may include, for example, copper, titanium-copper alloy, or other suitable choice of materials. In some embodiments, the seed material layer SL is formed to be in direct contact with the dielectric layer 504 and the conductive patterns 502. Thereafter, a photoresist layer PR1 is formed over the seed material layer SL. In some embodiments, the photoresist layer PR1 may be formed through spin-coating or other suitable formation methods. As illustrated in FIG. 6L, the photoresist layer PR1 has a plurality of openings OP1 exposing at least a portion of the seed material layer SL. In some embodiments, the locations of the openings OP1 correspond to the locations of the conductive patterns 502.

Referring to FIG. 6L and FIG. 6M, a plurality of conductive material patterns 512a are formed on the seed material layer SL. In some embodiments, a conductive material (not shown) is filled into the openings OP1 of the photoresist layer PR1. Thereafter, the photoresist layer PR1 is removed to obtain the conductive material patterns 512a. Upon removal of the photoresist layer PR1, portions of the seed material layer SL, which are not covered by the conductive material patterns 512a, are exposed. In some embodiments, the conductive material may be formed by a plating process. The plating process is, for example, electro-plating, electroless-plating, immersion plating, or the like. In some embodiments, the conductive material includes, for example, copper, copper alloys, or the like. The photoresist pattern layer PR1 may be removed/stripped through, for example, etching, ashing, or other suitable removal processes.

Referring to FIG. 6N, a photoresist layer PR2 is formed over the seed material layer SL and the conductive material patterns 512a. In some embodiments, the photoresist layer PR2 may be formed through spin-coating or other suitable formation methods. As illustrated in FIG. 6N, the photoresist layer PR2 has a plurality of openings OP2 exposing at least a portion of the conductive material patterns 512a.

Referring to FIG. 6N and FIG. 6O, a plurality of conductive patterns 516 is formed on the conductive material patterns 512a. In some embodiments, a conductive material (not shown) is filled into the openings OP2 of the photoresist layer PR2. Thereafter, the photoresist layer PR2 is removed to obtain the conductive patterns 516. In some embodiments, the conductive material may be formed by a plating process. The plating process is, for example, electro-plating, electroless-plating, immersion plating, or the like. In some embodiments, the conductive material includes, for example, copper, copper alloys, or the like. In some embodiments, the plating process of the conductive patterns 516 shares the same seed layer with the plating process of the conductive material patterns 512a. That is, the seed material layer SL may be utilized as a seed layer for plating for both of the conductive patterns 516 and the conductive material patterns 512a. The photoresist pattern layer PR2 may be removed/stripped through, for example, etching, ashing, or other suitable removal processes.

Referring to FIG. 6O and FIG. 6P, the seed material layer SL that is not covered by the conductive material patterns 512a is removed to render seed layer patterns 512b. The exposed portions of the seed material layer SL may be removed through an etching process. In some embodiments, the conductive material patterns 512a and the seed layer patterns 512b may be collectively referred to as conductive patterns 512. In some embodiments, the conductive patterns 512 may be referred to as first routing patterns while the conductive patterns 516 may be referred to as conductive vias.

Referring to FIG. 6Q, a dielectric layer 514 is formed on the first sub-layer to encapsulate the conductive patterns 512 and the conductive patterns 516. In some embodiments, the material and the formation method of the dielectric layer 514 may be similar to the dielectric layer 504, so the detailed description thereof is omitted herein. In some embodiments, the conductive patterns 512, the conductive patterns 516, and the dielectric layer 514 may be collectively referred to as a second sub-layer of the subsequently formed redistribution structure.

Referring to FIG. 6R, a plurality of conductive material patterns 522a and a plurality of seed layer patterns 522b are formed on the second sub-layer. In some embodiments, the material and the formation method of the conductive material patterns 522a and the seed layer patterns 522b may be respectively similar to the conductive material patterns 512a and the seed layer patterns 512b, so the detailed descriptions thereof are omitted herein. In some embodiments, the conductive material patterns 522a and the seed layer patterns 522b may be collectively referred to as conductive patterns 522. As illustrated in FIG. 6R, the conductive patterns 522 are formed to be directly in contact with the conductive patterns 516. In some embodiments, the conductive patterns 522 may be referred to as second routing patterns.

Referring to FIG. 6S, a dielectric layer 524 is formed over the second sub-layer and the conductive patterns 522. For example, the dielectric layer 524 is stacked on the dielectric layer 514. The dielectric layer 524 has a plurality of openings OP3. In some embodiments, the openings OP3 partially exposes the conductive patterns 522. The dielectric layer 524 may be formed by the following steps. First, a dielectric material layer (not shown) is formed over the dielectric layer 514 to cover the conductive patterns 522. In some embodiments, a material of the dielectric material layer includes polyimide, epoxy resin, acrylic resin, phenol resin, BCB, PBO, or any other suitable polymer-based dielectric material. The dielectric material layer may be formed by suitable fabrication techniques, such as spin-on coating, chemical vapor deposition (CVD), plasma-enhanced chemical vapor deposition (PECVD), or the like. Thereafter, the dielectric material layer may be patterned through a photolithography process and an etching process to render the dielectric layer 524 having the openings OP3.

Referring to FIG. 6T, a plurality of conductive patterns 532 is formed on the conductive patterns 522 to obtain a redistribution structure 500. In some embodiments, the conductive patterns 532 includes a plurality of conductive material patterns 532a and a plurality of seed layer patterns 532b. In some embodiments, the conductive patterns 532 may be formed by the following steps. First, a seed material layer (not shown) extending into the openings OP3 may be formed over the dielectric layer 524. The seed material layer may be formed through, for example, a sputtering process, a physical vapor deposition (PVD) process, or the like. In some embodiments, the seed material layer may include, for example, copper, titanium-copper alloy, or other suitable choice of materials. A mask pattern (not shown) may then be formed on the seed material layer. The mask pattern has openings exposing the seed material layer located inside of the openings OP3. In some embodiments, the openings of the mask pattern also exposes portions of the seed material layer in proximity of the openings OP3. Thereafter, a conductive material (not shown) is filled into the openings of the mask pattern and the openings OP3 of the dielectric layer 524 by electroplating or deposition. Then, the mask pattern and the seed material layer underneath the mask pattern are removed to obtain the conductive material patterns 532a and the seed layer patterns 532b.

In some embodiments, the conductive patterns 532 may be referred to a under-ball metallurgy (UBM) patterns. In some embodiments, the conductive patterns 522, the conductive patterns 532, and the dielectric layer 524 may be collective referred to as a third sub-layer of the redistribution structure 500. Although FIG. 6E to FIG. 6T illustrated that the conductive patterns in the second and third sub-layers are formed by different methods as that of the conductive patterns in the first sub-layer, the disclosure is not limited thereto. In some alternative embodiments, the pattern forming methods shown in FIG. 6E to FIG. 6I, FIG. 7A to FIG. 7C, and FIG. 8A to FIG. 8C may also be utilized to form the conductive patterns in the second sub-layer and the third sub-layer. It should be noted that although the redistribution structure 500 is illustrated to have three sub-layers in FIG. 6T, the disclosure is not limited thereto. In some alternative embodiments, the redistribution structure 500 may be constituted by more or less layers of sub-layers depending on the circuit design. In some embodiments, the redistribution structure 500 may be referred to as ultra-high density (UHD) redistribution structure.

Referring to FIG. 6U, after the redistribution structure 500 is formed, a plurality of conductive terminals 600 is placed on the conductive patterns 532 (the UBM patterns) of the redistribution structure 500. In some embodiments, the conductive terminals 600 are electrically connected to the redistribution structure 500. In some embodiments, the conductive terminals 600 include solder balls. In some embodiments, the conductive terminals 600 may be placed on the UBM patterns through a ball placement process.

Referring to FIG. 6V, the dielectric layer 100 formed on the bottom surface of the encapsulant 400 is de-bonded from the de-bonding layer DB such that the dielectric layer 100 is separated from the carrier C. That is, the carrier C is removed. In some embodiments, the de-bonding layer DB (e.g., the LTHC release layer) may be irradiated by an UV laser such that the dielectric layer 100 is peeled off from the carrier C. As illustrated in FIG. 6V, the dielectric layer 100 is then patterned such that a plurality of openings OP4 is formed to partially expose the conductive structures 200. In some embodiments, the openings OP4 of the dielectric layer 100 are formed by a laser drilling process, a mechanical drilling process, or other suitable processes.

Referring to FIG. 6V and FIG. 6W, a plurality of conductive terminals 700 is formed in the openings OP4. The conductive terminals 700 are electrically connected to the conductive structures 200. In some embodiments, the conductive terminals 700 include solder balls. In some embodiments, a singulation process may be performed to obtain the package 10.

In accordance with some embodiments of the disclosure, a method for forming a pattern includes at least the following steps. A first and a second material abutting the first material are provided. The first material and the second material have different radiation absorption rates. A blocking layer is formed over the first material and the second material. The blocking layer is globally irradiated with an electromagnetic radiation to allow part of the blocking layer to turn into a crosslinked portion. The remaining blocking layer forms a non-crosslinked portion. The non-crosslinked portion covers the second material. The non-crosslinked portion of the blocking layer is removed to expose the second material. A third material is formed over the exposed second material. The crosslinked portion of the blocking layer is removed.

In accordance with some alternative embodiments of the disclosure, a method for forming a pattern includes at least the following steps. A first material and a second material in contact with the first material are provided. The first material and the second material have different radiation absorption rates. A blocking layer is formed over the first material and the second material. The blocking layer is globally irradiated with an electromagnetic radiation to allow part of the blocking layer to turn into a crosslinked portion. The remaining blocking layer forms a non-crosslinked portion. The non-crosslinked portion covers the first material. The non-crosslinked portion is removed while the crosslinked portion is left on the second material.

In accordance with some embodiments of the disclosure, a manufacturing method of a package includes at least the following steps. A die is provided. The die includes a plurality of metallic posts. The die is encapsulated by an encapsulant. A redistribution structure is formed over the die and the encapsulant. The redistribution structure is formed by at least the following steps. A blocking layer is formed over the encapsulant and the metallic posts. The blocking layer is globally irradiated with an electromagnetic radiation to allow part of the blocking layer to turn into a crosslinked portion. The remaining blocking layer forms a non-crosslinked portion. The non-crosslinked portion covers the encapsulant. The non-crosslinked portion of the blocking layer is removed to form a plurality of conductive patterns located on the exposed portion of the metallic posts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a pattern, comprising:
   providing a first material and a second material in contact with the first material, wherein the first material and the second material have different radiation absorption rates;
   forming a blocking layer over the first material and the second material wherein a material of the blocking layer comprises a complex compound having a metal core with organic ligands, and the organic ligands comprise benzoic acids, sulfonic acids, or methyl methacrylates;
   globally irradiating the blocking layer with an electromagnetic radiation such that the blocking layer globally and directly receives the electromagnetic radiation to allow part of the blocking layer to turn into a crosslinked portion, wherein the remaining blocking layer forms a non-crosslinked portion, and the non-crosslinked portion is in direct contact with the first material to cover the first material; and
   removing the non-crosslinked portion while leaving the crosslinked portion on the second material.

2. The method according to claim 1, wherein the first material laterally surrounds the second material.

3. The method according to claim 1, wherein the first material is located on the second material and partially exposes the second material.

4. The method according to claim 1, wherein the material of the blocking layer further comprises a cross-linking agent.

5. The method according to claim 1, further comprising: removing the organic ligands in the blocking layer.

6. The method according to claim 5, wherein the organic ligands are removed through a plasma ashing process.

7. The method according to claim 1, wherein the electromagnetic radiation is provided by performing a laser annealing process or a rapid thermal process (RTP).

8. The method according to claim 1, wherein the radiation absorption rate of the second material is greater than the radiation absorption rate of the first material.

9. A method for forming a pattern, comprising:
- providing a first material and a second material abutting the first material, wherein a top surface of the first material is coplanar with a top surface of the second material, and a radiation absorption rate of the second material is greater than a radiation absorption rate of the first material;
- forming a blocking layer over the first material and the second material, wherein a material of the blocking layer comprises a complex compound having a metal core with organic ligands, and the organic ligands comprise benzoic acids, sulfonic acids, or methyl methacrylates;
- globally irradiating the blocking layer with an electromagnetic radiation such that the blocking layer globally and directly receives the electromagnetic radiation to allow part of the blocking layer to turn into a crosslinked portion, wherein the remaining blocking layer forms a non-crosslinked portion, the non-crosslinked portion covers the first material and the crosslinked portion covers the second material; and
- removing the non-crosslinked portion while leaving the crosslinked portion on the second material.

10. The method according to claim 9, wherein the metal core comprises aluminum, titanium, copper, nickel, gold, silver, tungsten, ruthenium, molybdenum, manganese, zirconium, hafnium, or alloys thereof.

11. The method according to claim 9, wherein the material of the blocking layer further comprises a cross-linking agent.

12. The method according to claim 9, further comprising: removing the organic ligands in the blocking layer.

13. The method according to claim 12, wherein the organic ligands are removed through a plasma ashing process.

14. The method according to claim 9, wherein the electromagnetic radiation is provided by performing a laser annealing process or a rapid thermal process (RTP).

* * * * *